(12) United States Patent
Hara et al.

(10) Patent No.: US 9,299,438 B2
(45) Date of Patent: Mar. 29, 2016

(54) SEMICONDUCTOR MEMORY DEVICE

(71) Applicant: Kabushiki Kaisha Toshiba, Minato-ku (JP)

(72) Inventors: Tokumasa Hara, Kawasaki (JP); Naoya Tokiwa, Fujisawa (JP); Hiroshi Sukegawa, Tokyo (JP); Hitoshi Iwai, Kamakura (JP); Toshifumi Shano, Fujisawa (JP); Shirou Fujita, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 116 days.

(21) Appl. No.: 14/028,647

(22) Filed: Sep. 17, 2013

(65) Prior Publication Data

US 2014/0369127 A1    Dec. 18, 2014

Related U.S. Application Data

(60) Provisional application No. 61/834,155, filed on Jun. 12, 2013.

(51) Int. Cl.
| | | |
|---|---|---|
| *G11C 11/34* | (2006.01) | |
| *G11C 16/04* | (2006.01) | |
| *G11C 16/10* | (2006.01) | |
| *G11C 16/26* | (2006.01) | |
| *G11C 29/28* | (2006.01) | |
| G11C 29/26 | (2006.01) | |

(52) U.S. Cl.
CPC ........ *G11C 16/0408* (2013.01); *G11C 16/0483* (2013.01); *G11C 16/10* (2013.01); *G11C 16/26* (2013.01); *G11C 29/28* (2013.01); *G11C 2029/2602* (2013.01)

(58) Field of Classification Search
CPC ........... G11C 16/0408; G11C 16/0483; G11C 16/10; G11C 16/26
USPC ........................... 365/185.17, 185.18, 185.23
See application file for complete search history.

(56) References Cited

U.S. PATENT DOCUMENTS

| | | | | |
|---|---|---|---|---|
| 6,898,121 | B2 * | 5/2005 | Chien et al. | 365/185.17 |
| 7,260,016 | B2 * | 8/2007 | Kouno | 365/230.04 |
| 7,710,774 | B2 * | 5/2010 | Chen et al. | 365/185.05 |
| 8,218,365 | B2 * | 7/2012 | Kim et al. | 365/185.2 |
| 8,717,817 | B2 * | 5/2014 | Cho et al. | 365/185.12 |
| 2005/0207259 | A1 | 9/2005 | Kouno | |
| 2010/0046290 | A1 * | 2/2010 | Park et al. | 365/185.2 |
| 2013/0114345 | A1 * | 5/2013 | Lee | 365/185.22 |
| 2014/0185383 | A1 * | 7/2014 | Shibata | 365/185.17 |
| 2015/0003151 | A1 * | 1/2015 | Lee | 365/185.02 |

FOREIGN PATENT DOCUMENTS

| | | |
|---|---|---|
| JP | 8-329700 | 12/1996 |
| JP | 2005-32375 | 2/2005 |
| JP | 2005-267811 | 9/2005 |

* cited by examiner

*Primary Examiner* — Viet Q Nguyen
(74) *Attorney, Agent, or Firm* — Oblon, McClelland, Maier & Neustadt, L.L.P.

(57) ABSTRACT

According to one embodiment, a semiconductor memory device includes a first string; a second string; and a controller. The first string is coupled with a first bit line and includes first memory cells. The second string is coupled with a second bit line and includes second memory cells. The controller executes writing first data into the first memory cells and writing second data into the second memory cells simultaneously. The controller reads data from the first and second strings after writing the first and second data.

7 Claims, 31 Drawing Sheets

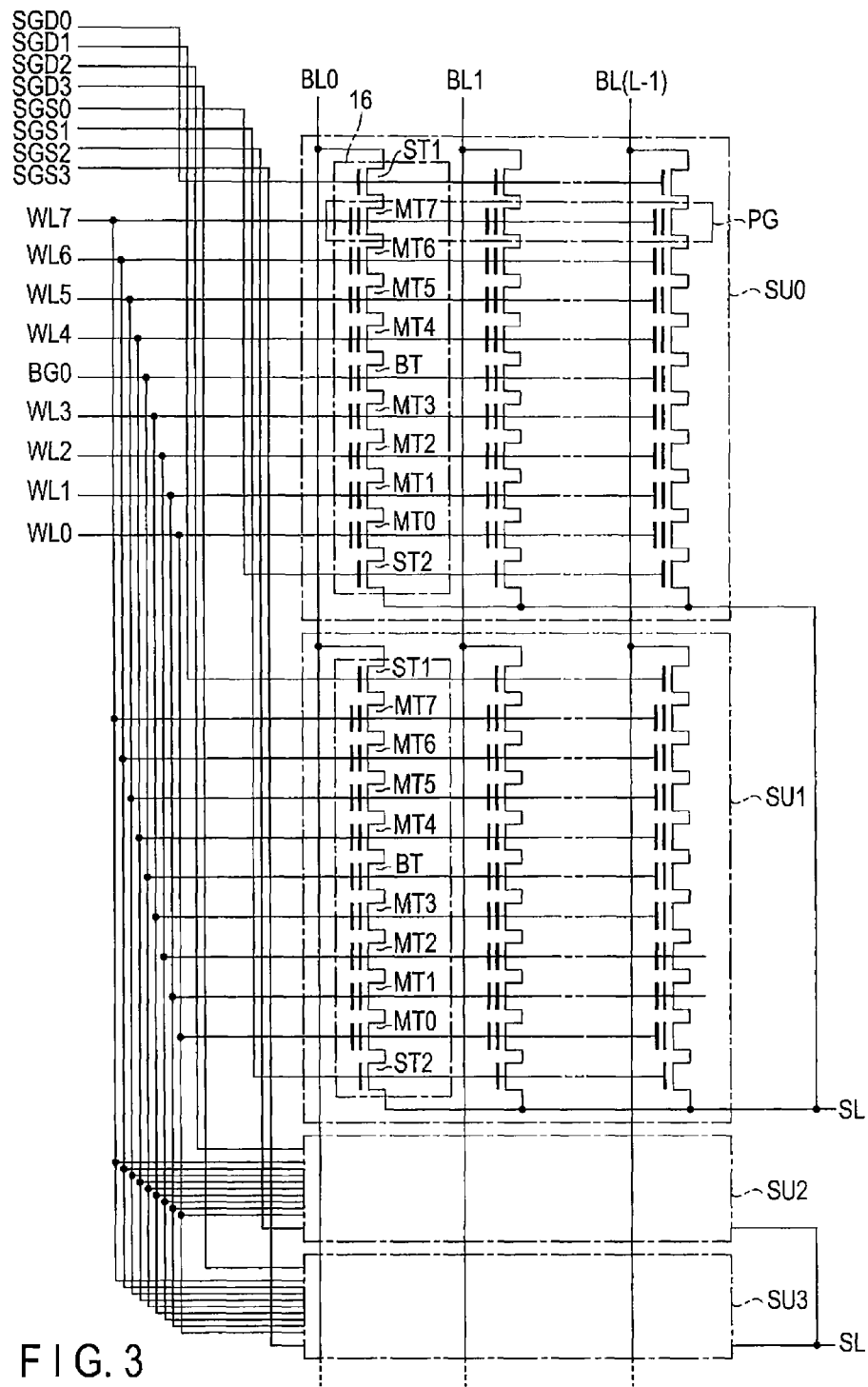
F I G. 3

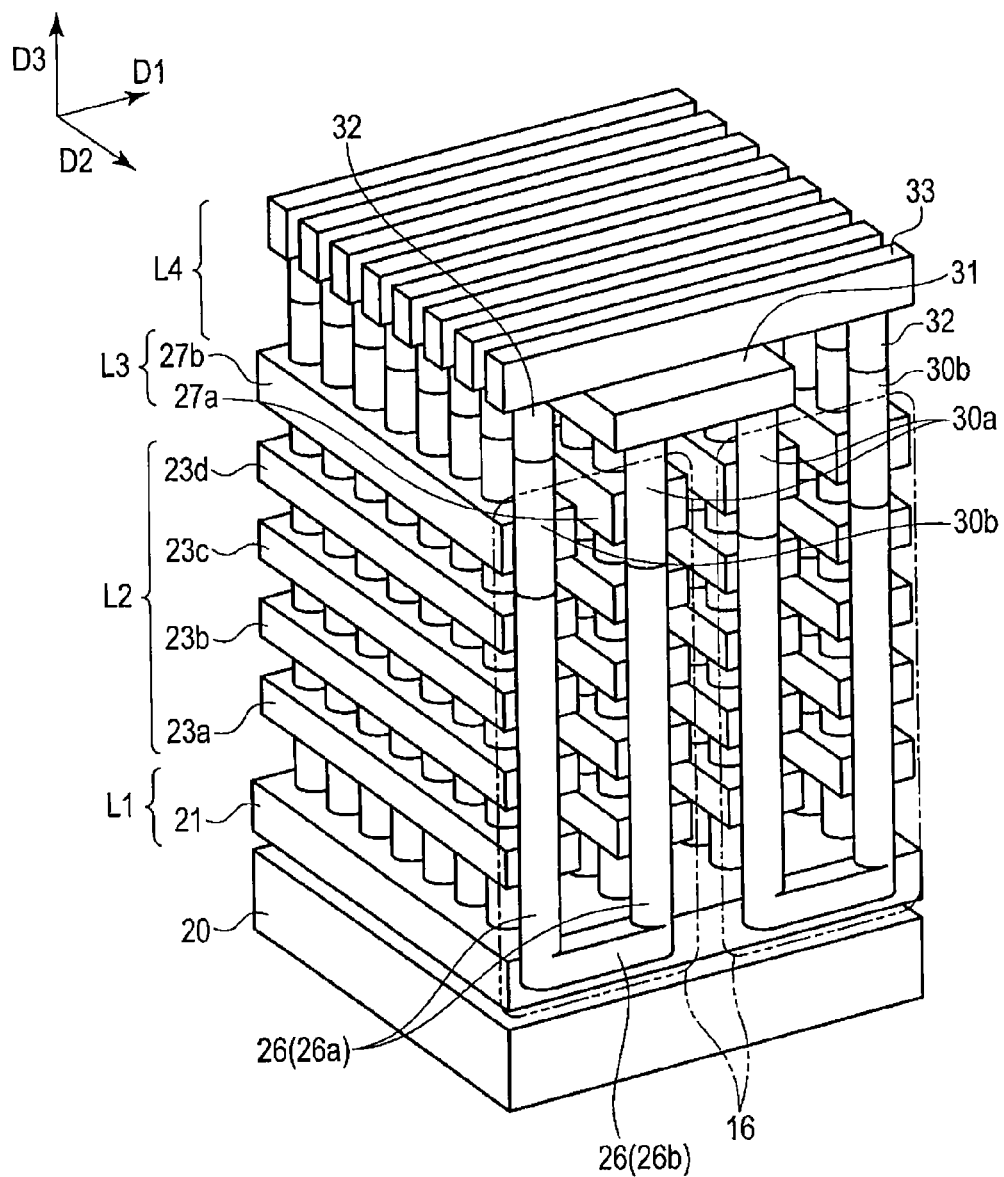
F I G. 4

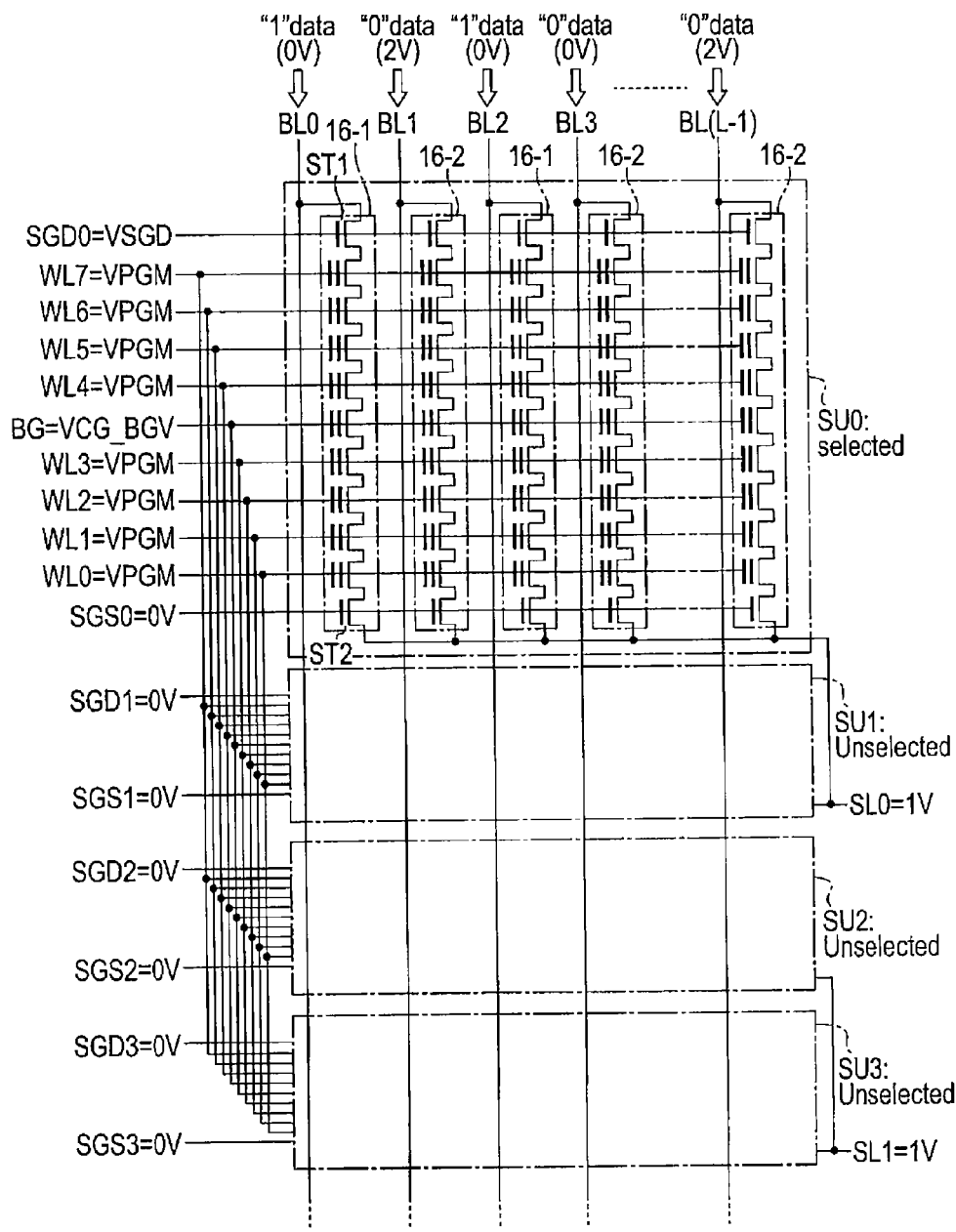
F I G. 8

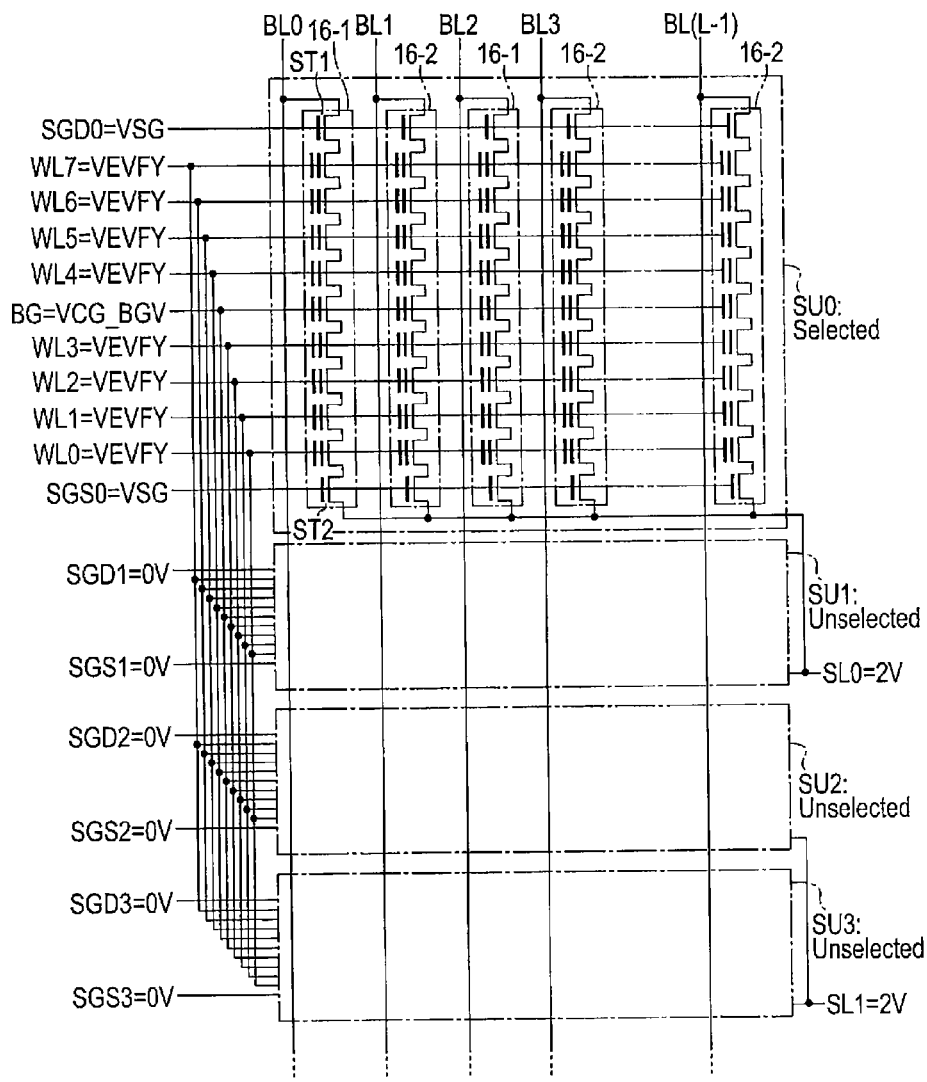
F I G. 10

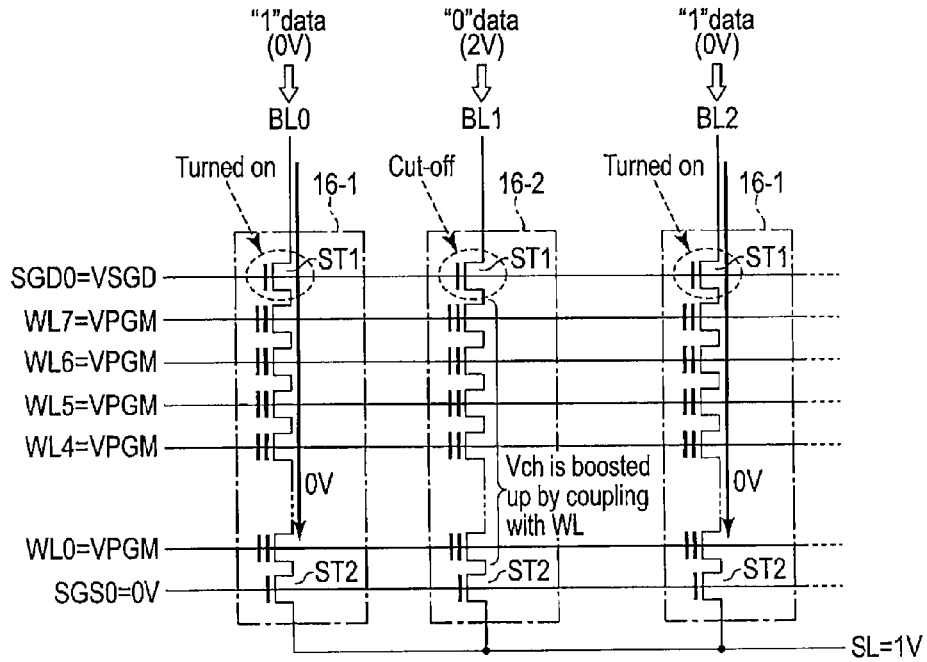
F I G. 11
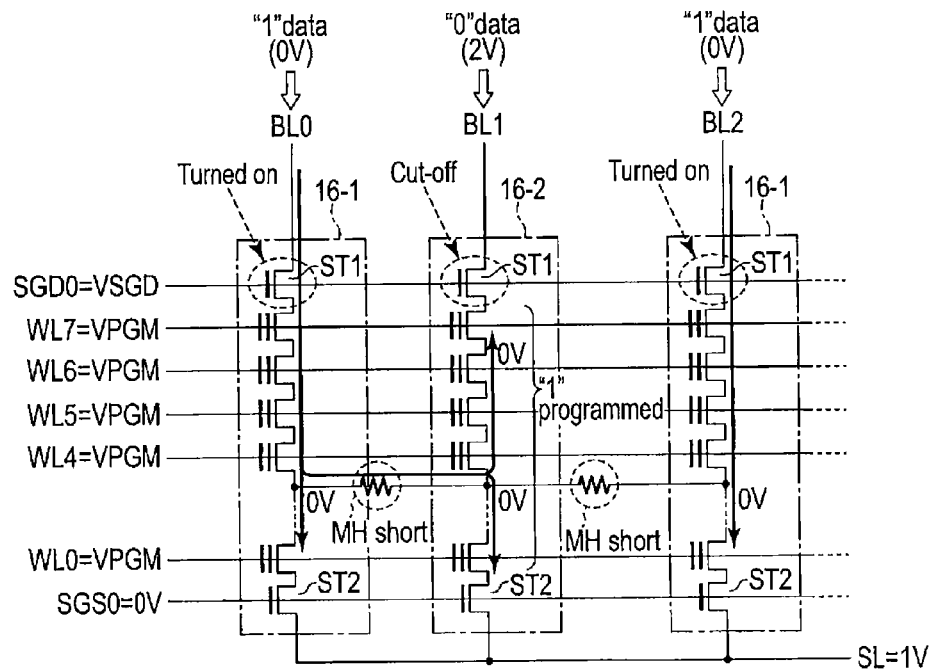
F I G. 12

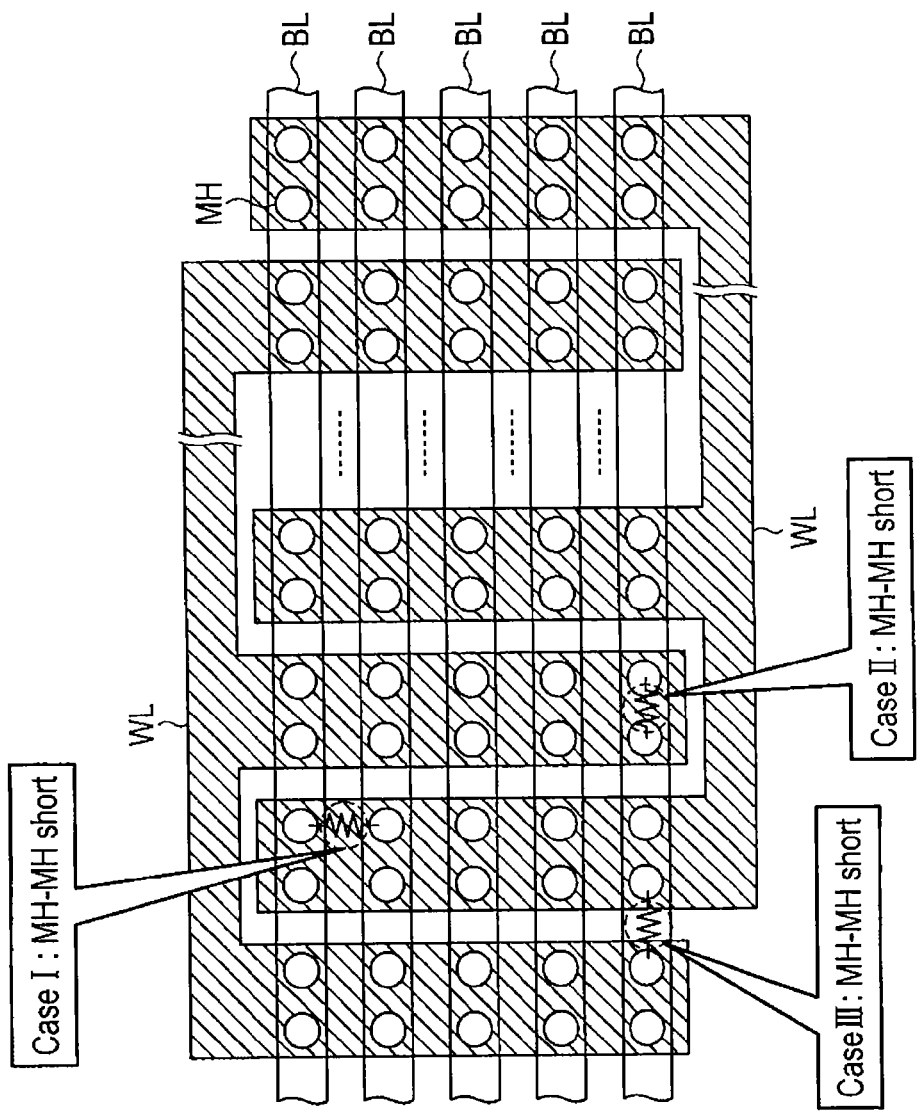
F I G. 16

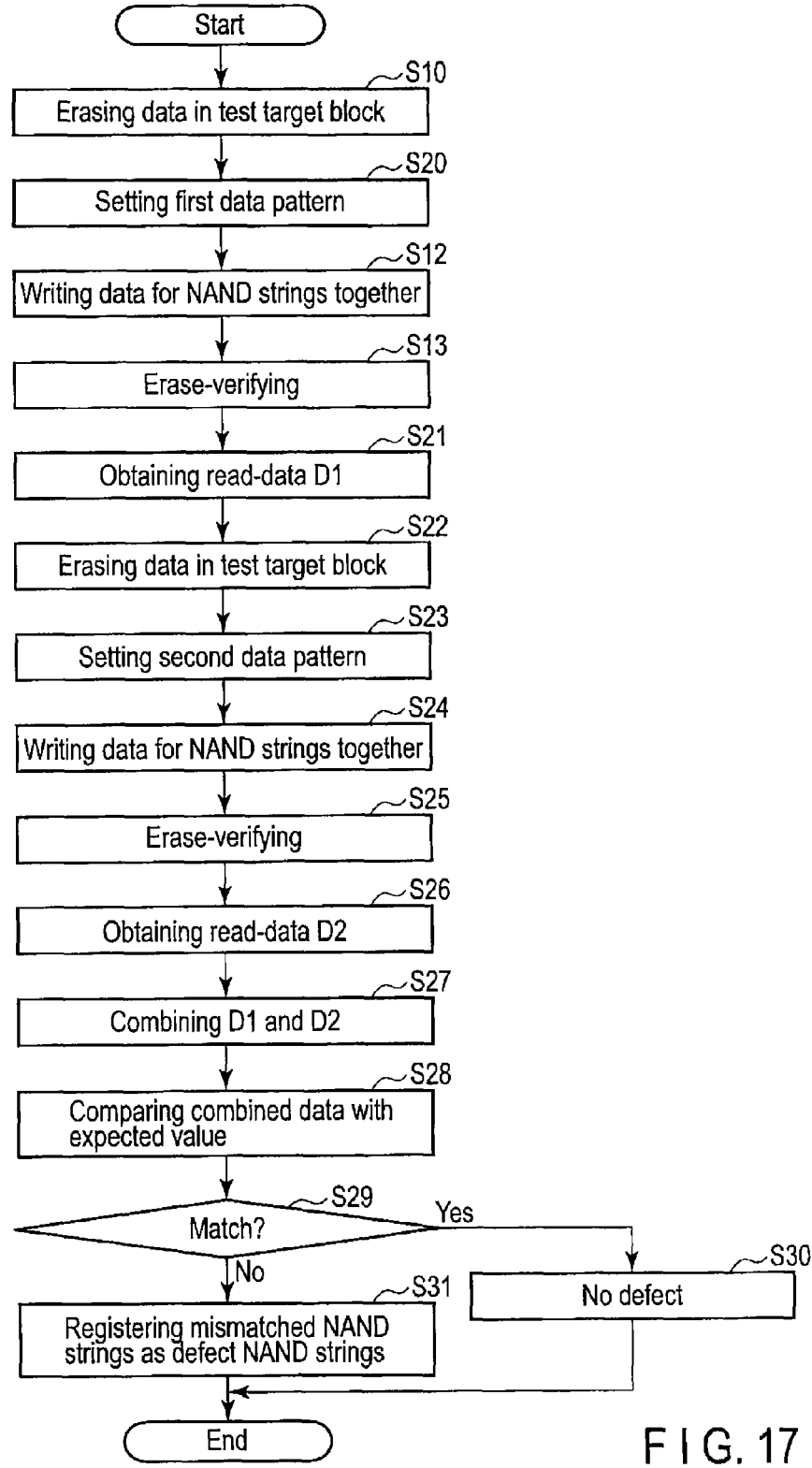
F I G. 17

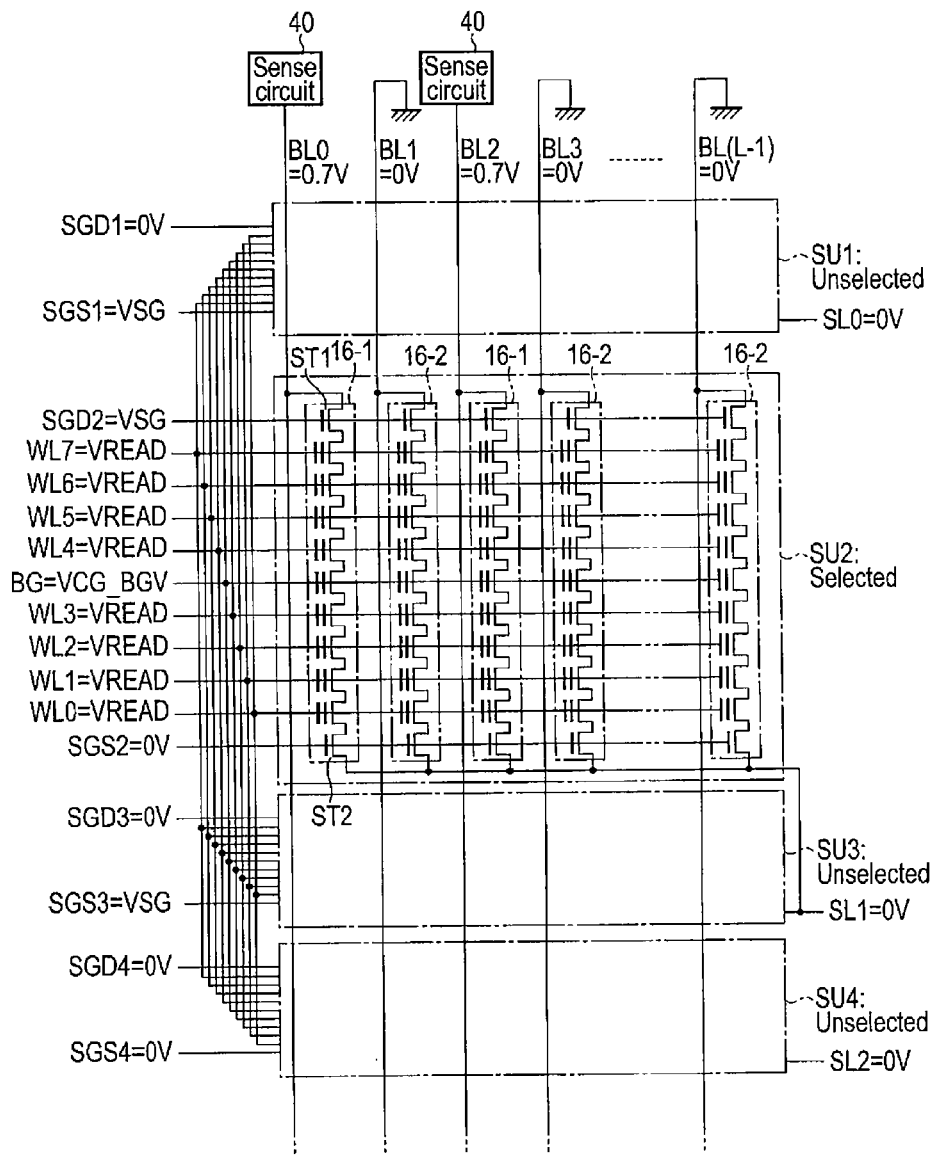
F I G. 21

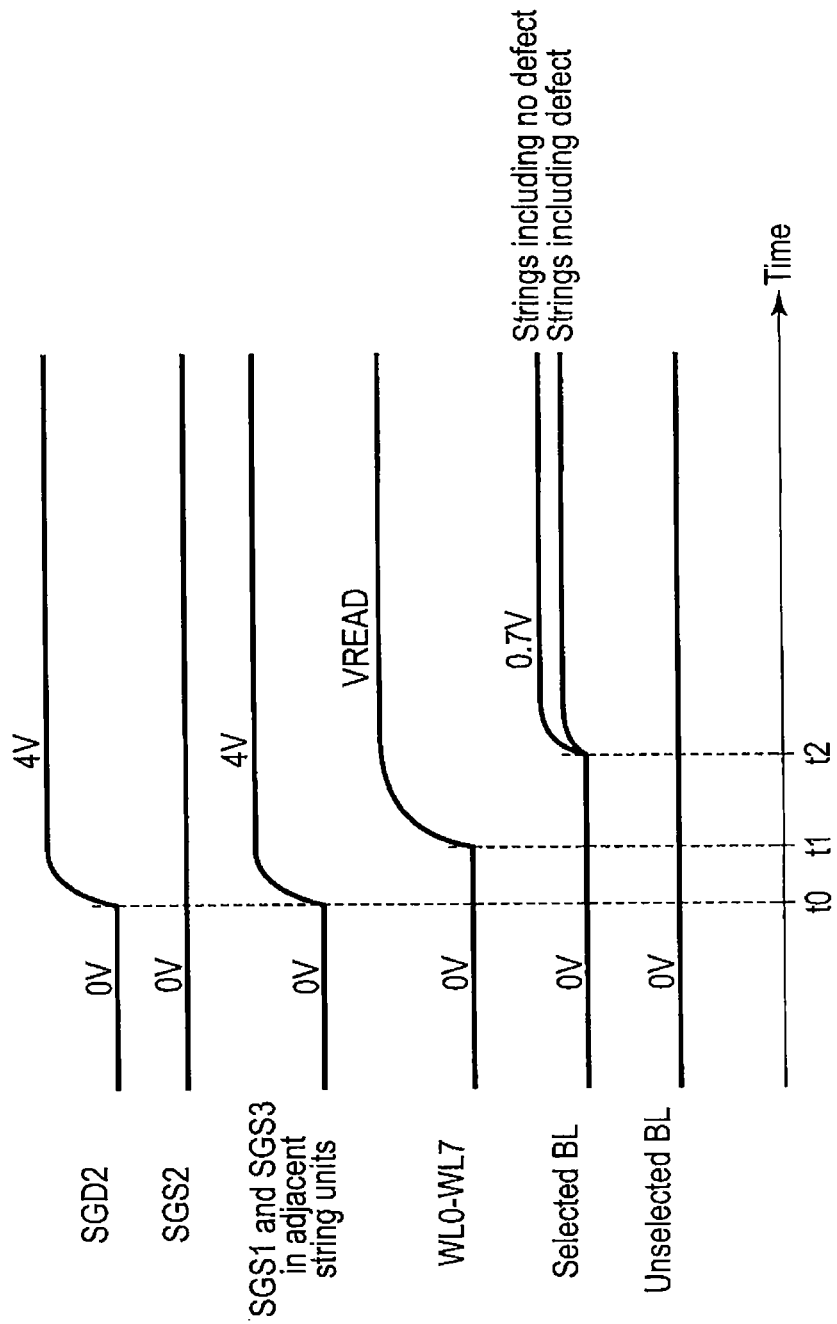
F I G. 22

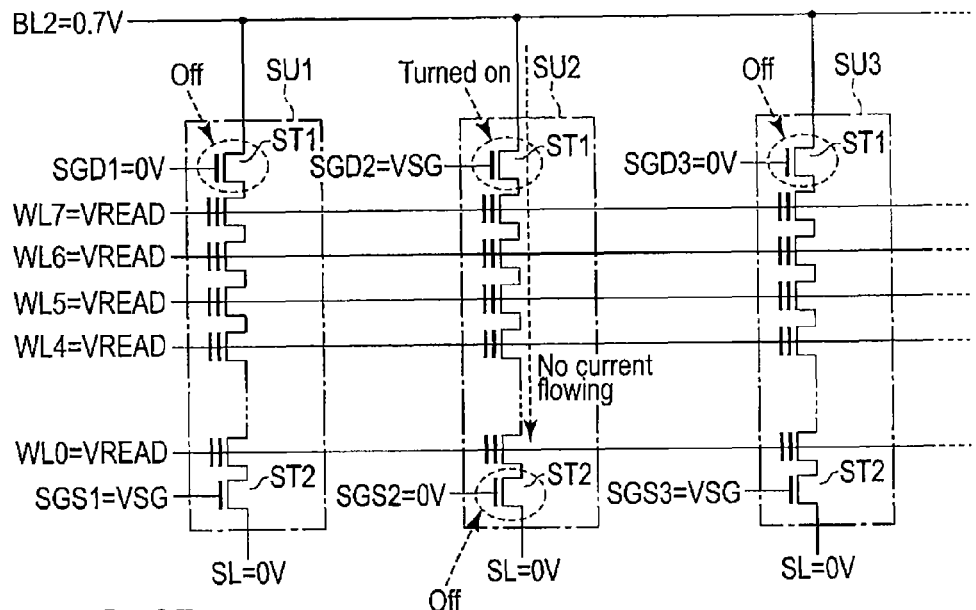
F I G. 25
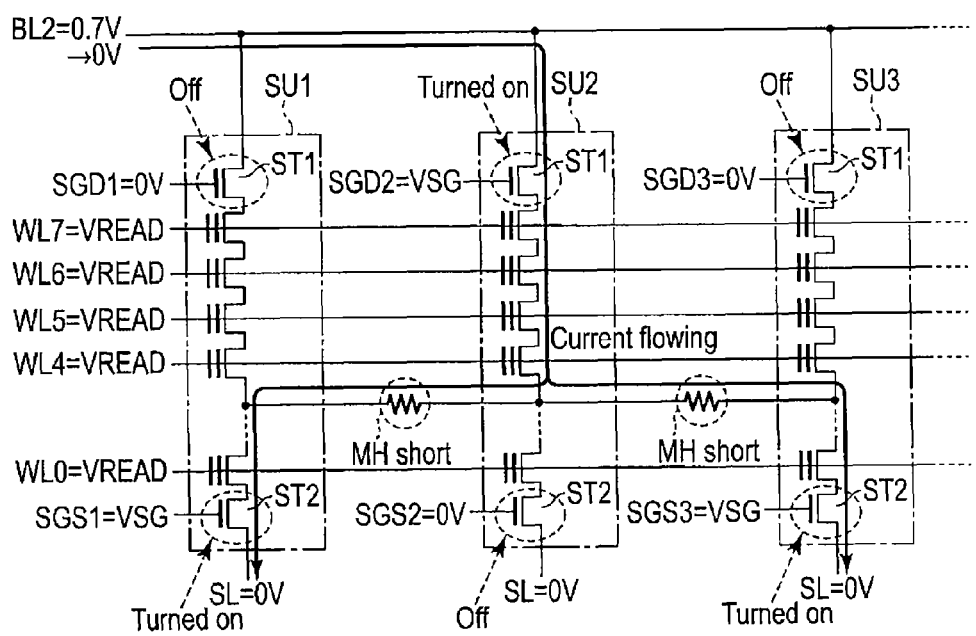
F I G. 26

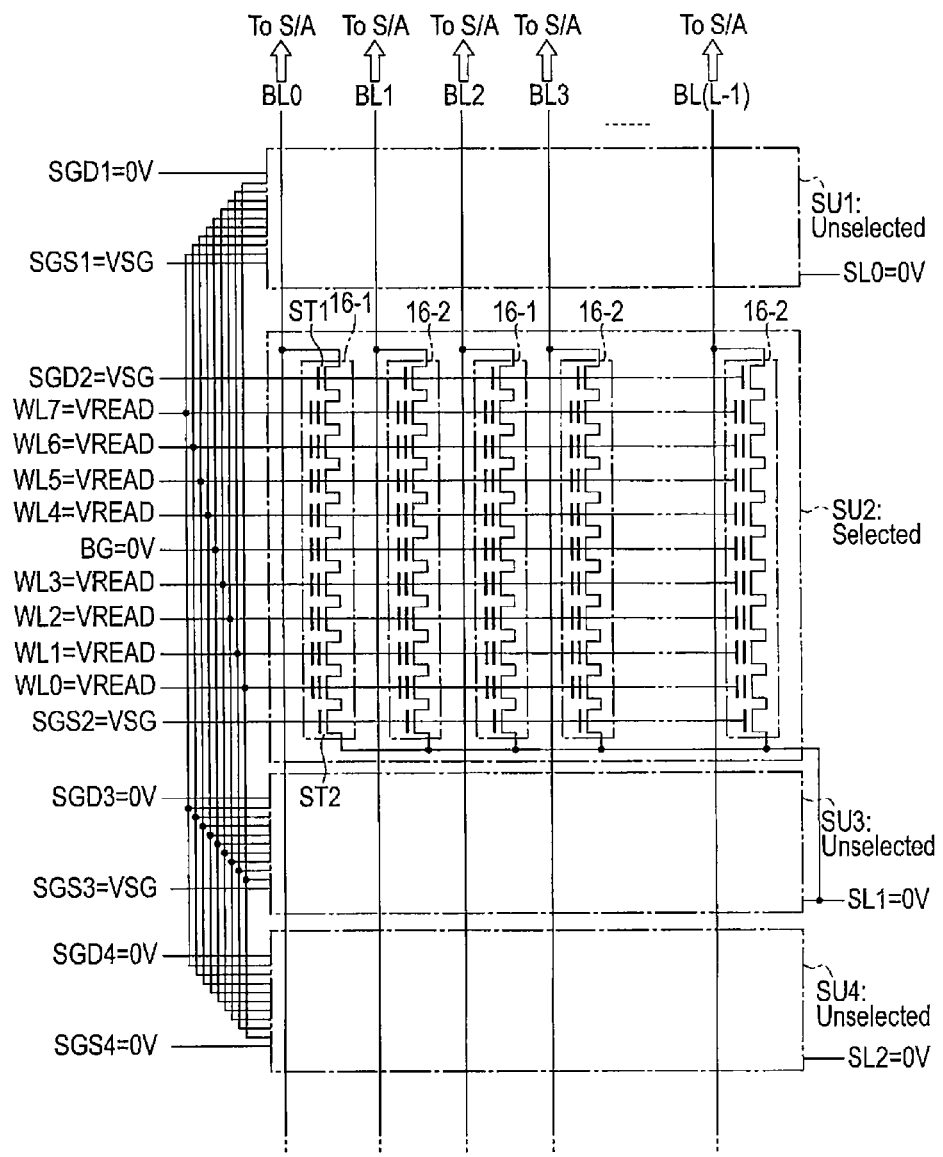
F I G. 30

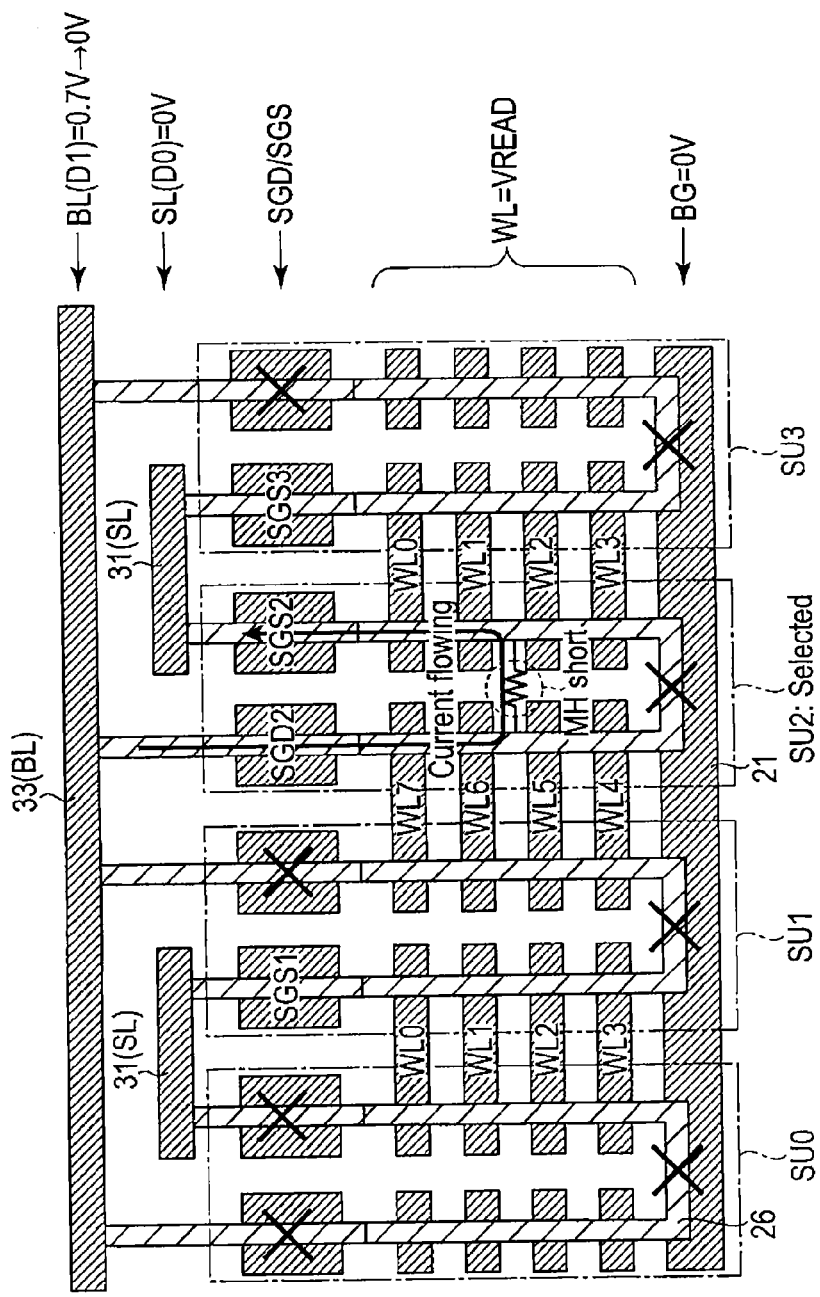
F I G. 33

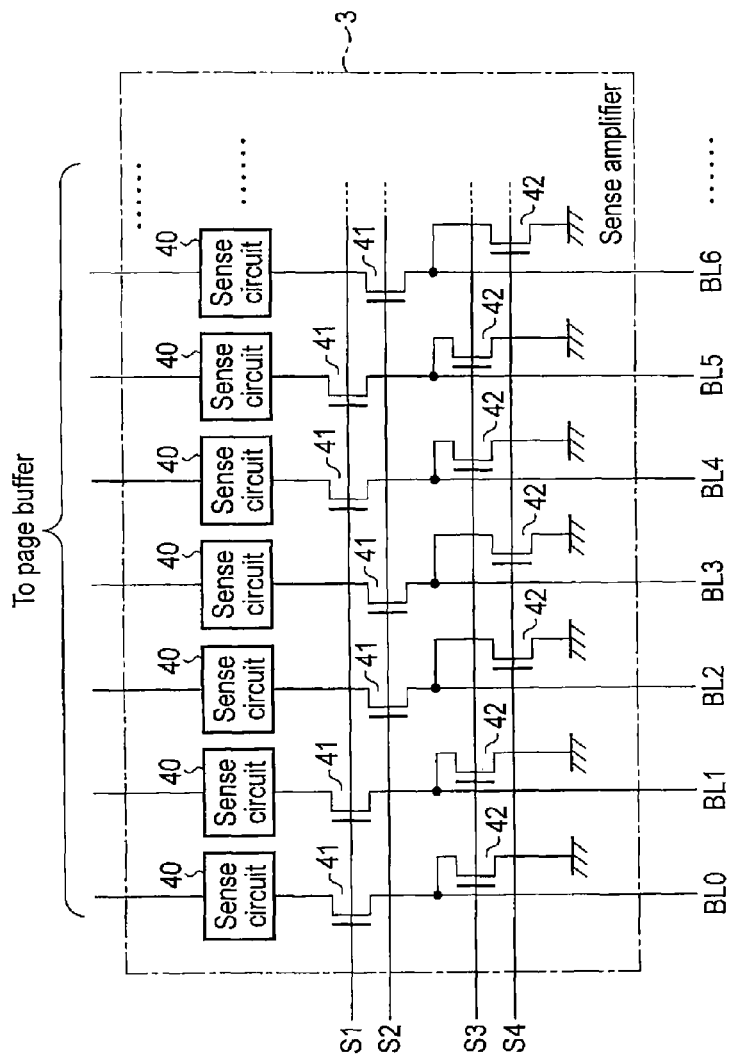
F I G. 36

SEMICONDUCTOR MEMORY DEVICE

CROSS-REFERENCE TO RELATED APPLICATIONS

This application claims the benefit of U.S. Provisional Application No. 61/834,155, filed Jun. 12, 2013, the entire contents of which are incorporated herein by reference.

FIELD

Embodiments described herein relate generally to a semiconductor memory device.

BACKGROUND

A NAND flash memory is known in which memory cells are three-dimensionally arranged.

BRIEF DESCRIPTION OF THE DRAWINGS

FIG. 3 is a circuit diagram of a memory cell array according to the first embodiment;

FIG. 4 and FIG. 5 are a perspective view and a cross-sectional view of the memory cell array according to the first embodiment;

FIG. 8 is a circuit diagram of the memory cell array according to the first embodiment;

FIG. 10 to FIG. 12 are circuit diagrams of the memory cell array according to the first embodiment;

FIG. 16 is a plan view of the memory cell array;

FIG. 17 is a flowchart of a test method according to a second embodiment;

FIG. 21 is a circuit diagram of a memory cell array according to the third embodiment;

FIG. 22 is a timing chart showing signals of various interconnects in the test method according to the third embodiment;

FIG. 23 to FIG. 26 are circuit diagrams of the memory cell array according to the third embodiment;

FIG. 30 is a circuit diagram of a memory cell array according to the fifth embodiment;

FIG. 32 and FIG. 33 are cross-sectional views of a memory cell array according to the fifth embodiment;

FIG. 36 is a circuit diagram of a sense amplifier according to the sixth embodiment.

DETAILED DESCRIPTION

In general, according to one embodiment, a semiconductor memory device includes: a first string; a second string; and a controller. The first string is coupled with a first bit line. The first string includes first memory cells coupled between a first selection transistor and a second selection transistor in series. The second string is coupled with a second bit line and adjacent to the first string. The second string includes second memory cells coupled between a third selection transistor and a fourth selection transistor in series. Gates of the first and third selection transistors are coupled in common, and gates of the second and fourth selection transistors are coupled in common. The controller controls access to the memory cells. The controller simultaneously executes writing first data into the first memory cells and writing second data into the second memory cells. Further, the controller reads out data from the first and second strings after writing the first and second data.

1. First Embodiment

A semiconductor memory device according to a first embodiment will now be described. As the semiconductor memory device, a description will be given as to an example of a three-dimensional stacked type NAND flash memory in which memory cells are stacked above a semiconductor substrate.

1.1 Configuration 1.1.1 Configuration of Memory System

Figure 1:
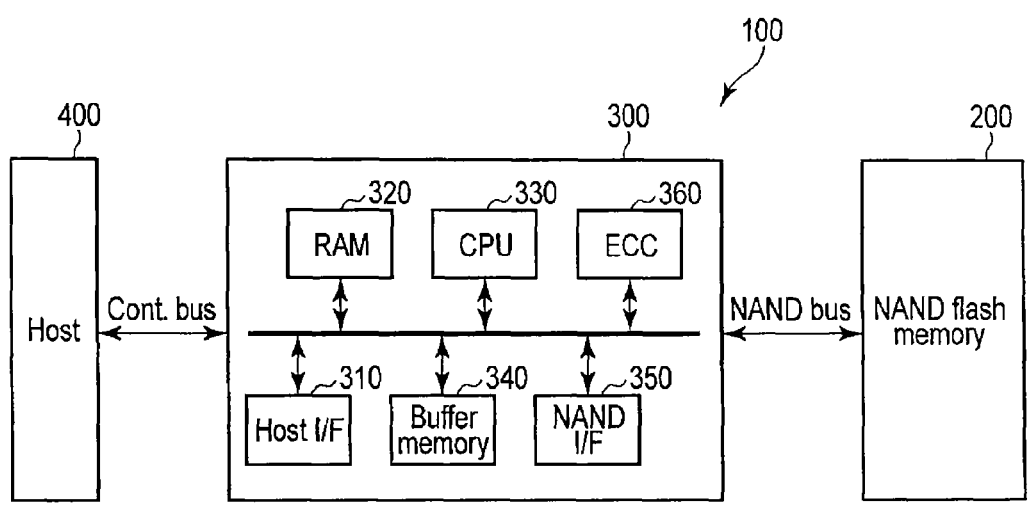
FIG. 1 is a block diagram of a memory system according to a first embodiment.

First, a configuration of a memory system including a semiconductor memory device according to this embodiment will now be described with reference to FIG. 1. FIG. 1 is a block diagram of the memory system according to this embodiment.

As shown in the drawing, a system memory 100 includes a NAND flash memory 200, a controller 300, and a host device 400.

The NAND flash memory 200 includes memory cells and stores data in a nonvolatile manner. Details of the configuration of the NAND flash memory 200 will be described later.

The controller 300 instructs the NAND flash memory 200 to read, write and erase, or the like in response to a command from the host device 400. Moreover, the controller 300 manages a memory space in the NAND flash memory 200. Additionally, the controller 300 tests whether the NAND flash memory 200 has a defect. This test will be described later in detail. As the controller 300 and the NAND type flash memory 200, for example, the same semiconductor device may be constituted. Moreover, the memory system 100 may be one device, and there is a memory card such as an SD™ card, a solid state drive (SSD), or the like as an example of this device. Additionally, the memory system 100 may be configured to have the embedded NAND flash memory 200 and controller 300 in a personal computer, and it is not restricted as long as an application having the NAND type flash memory 200 embedded therein is adopted.

The controller 300 includes a host interface circuit 310, an embedded memory (RAM) 320, a processor (CPU) 330, a buffer memory 340, a NAND interface circuit 350, and an ECC circuit 360.

The host interface circuit 310 is connected to the host device 400 through a controller bus and controls communication with the host device 400. Further, the host interface circuit 310 transfers a command and data received from the host device 400 to the CPU 330 and the buffer memory 340, respectively. Further, the host interface circuit 310 transfers data in the buffer memory 340 to the host device 400 in response to a command from the CPU 330.

The NAND interface circuit 350 is connected to the NAND flash memory 200 through an NAND bus and controls communication with the NAND flash memory 200. Furthermore, the NAND interface circuit 350 transfers a command received from the CPU 330 to the NAND flash memory 200, or transfers write data in the buffer memory 340 to the NAND flash memory 200 at a write operation. Moreover, at a read operation, the NAND interface circuit 350 transfers data read from the NAND flash memory 200 to the buffer memory 340.

The CPU 330 controls an entire operation of the controller 300. For example, when receiving a read command from the host device 400, the CPU 330 issues a read command based on the NAND interface in response to the command from the host device 400. It similarly operates in the case of write and erase. Additionally, the CPU 330 executes various kinds of processing, e.g., wear leveling for managing the NAND flash memory 200. Further, the CPU 330 executes various kinds of arithmetic operations. For example, the CPU 330 executes data encryption processing or randomization processing. Furthermore, the CPU 330 issues a later-described test command of the NAND flash memory 200.

The ECC circuit 360 executes data error checking and correcting (ECC) processing. That is, the ECC circuit 360 generates a parity based on write data at a data write operation, or generates a syndrome from the parity, detects an error, and corrects the error at a read operation. It is to be noted that the CPU 330 may have a function of the ECC circuit 360.

The embedded memory 320 is, e.g., a semiconductor memory such as a DRAM, and it is used as a work area of the CPU 330. Moreover, the embedded memory 320 holds firmware for managing the NAND flash memory 200 or various kinds of management tables.

1.1.2 Configuration of Semiconductor Memory Device

The semiconductor memory device according to this embodiment will now be described.

1.1.2.1 Overall Configuration of Semiconductor Memory Device

Figure 2:
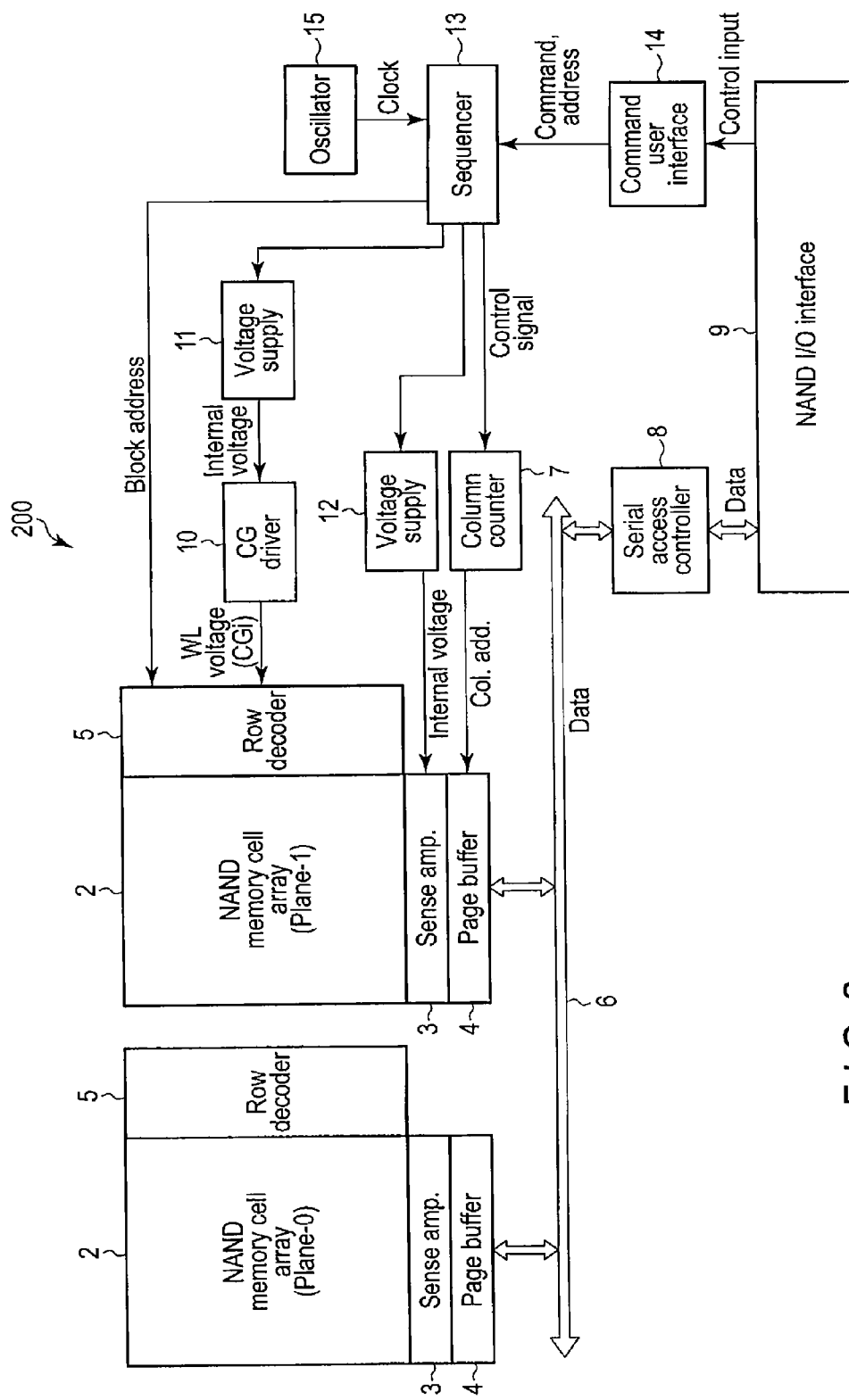
FIG. 2 is a block diagram of a semiconductor memory device according to the first embodiment.

FIG. 2 is a block diagram of the NAND flash memory according to this embodiment. As shown in the drawing, the NAND flash memory 200 includes a memory cell array 2, a sense amplifier 3, a page buffer 4, a row decoder 5, a data bus 6, a column counter 7, a serial access controller 8, an I/O interface 9, a CG driver 10, voltage generation circuits 11 and 12, a sequencer 13, a command user interface 14, and an oscillator 15.

The memory cell array 2 includes three-dimensionally stacked nonvolatile memory cells. In the memory cell array 2, memory cells in the same row are connected to the same word line, and memory cells in the same column are connected to the same bit line. Data to be written into a memory cell and data to be read out of a memory cell are transferred through a bit line. In the example shown in FIG. 2, although the memory 1 includes the two memory cell arrays 2, it may include one memory cell array, or it may include three or more arrays.

The sense amplifier 3, the page buffer 4, and the row decoder 5 are provided in association with each memory cell array 2. The sense amplifier 3 senses and amplifies data read from the memory cell to the bit line. The page buffer 4 includes a latch circuit associated with the respective bit lines, and it temporarily holds the data sensed and amplified by the sense amplifier 3 and outputs the data to the data bus 6 at a data read operation. Additionally, at a data write operation, the page buffer 4 temporarily holds the write data and transfers the write data to the bit line. The row decoder 5 selects a row direction of the memory cell array 2. That is, the row decoder 5 selects a word line.

The voltage generation circuit 12 generates a voltage that is to be applied to the bit lines and supplies the voltage to the sense amplifier 3 at a data read operation and a data write operation. The sense amplifier 3 applies a necessary voltage to the bit lines in accordance with write data in the page buffer 4. The column counter 7 receives a control signal from the sequencer 13 at a data read operation and a data write operation. Further, the column counter 7 obtains a column address from the received control signal and outputs it to the page buffer 4. The page buffer 4 decodes the column address and connects latches in the page buffer 4 to the data bus 6 based on a result of decoding.

The voltage generation circuit 11 generates voltages to be applied to the word lines and supplies the voltages to the CG driver 10 at a reading, writing, or erasing data. The CG driver 10 transfers a necessary voltage in voltages supplied from the voltage generation circuit 11 to a word line selected by the row decoder 5 and unselected word lines.

The I/O interface 9 controls transmission/reception of a signal to or from the controller 300 or the host device 400. The I/O interface 9 receives a control signal (a write command and an address) and write-data from the controller 300 at a writing data. Furthermore, the I/O interface 9 transfers the control signal to the command user interface 14 and also transfers the write data to the serial access controller 8. At a reading data, the I/O interface 9 receives a control signal (a read command and an address) from the controller 300 and transfers it to the command user interface 14. Moreover, the I/O interface 9 receives read data from the serial access controller 8 and transfers the read data to the controller 300.

The data bus 6 transfers the read data to the serial access controller 8 from the page buffer 4 at a reading data and transfers the write data to the page buffer 4 from the serial access controller 11 at a writing data.

The serial access controller 11 controls parallel transfer of data on the data bus 6. At a writing data, data from the controller 300 is serially transmitted to the I/O interface 9. The serial data is transferred to the page buffer 4 on the data bus 6 in a parallel manner. At a reading data, the operation is reversed. Such control is carried out by the serial access controller 11.

The command user interface 14 receives a control signal from the I/O interface 9, decodes the control signal, and obtains a command and an address. Additionally, the command user interface 14 transfers them to the sequencer 13. The oscillator 15 generates a clock.

The sequencer 13 controls an entire operation of the NAND flash memory 200. The sequencer 13 controls operations of the column counter 7 and the voltage generation circuits 11 and 12 based on the clock from the oscillator 15 and the command and the address from the command user interface 14.

1.1.2.2 Memory Cell Array 2

Particulars of the configuration of the memory cell array 2 will now be described. The memory cell array 2 includes a plurality of blocks. Data in the same block is collectively erased.

A configuration of the block will now be described with reference to FIG. 3. FIG. 3 is a circuit diagram of a block.

As shown in the drawing, the block includes M (M is a natural number equal to or more than 2) string units SU (SU0 to SU(M−1)). Furthermore, each string unit SU includes L (L is a natural number equal to or more than 2) NAND strings 16.

Each of the NAND strings 16 includes, e.g., eight memory cell transistors MT (MT0 to MT7), selection transistors ST1 and ST2, and a back-gate transistor BT. The memory cell transistor MT includes a stacked gate including a control gate and a charge storage layer and holds data in the nonvolatile manner. The number of the memory cell transistors MT is not restricted to 8, and it may be 16, 32, 64, or 128, and this number is not restricted. Like the memory cell transistor MT, the back-gate transistor BT includes a stacked gate including a control gate and a charge storage layer. However, the back-gate transistor BT is not configured to hold data, and it functions as a merely current path at writing and erasing data. The memory cell transistors MT and the back-bate transistor BT are arranged between the selection transistors ST1 and ST2 so that their current paths are connected in series. It is to be noted that the back-gate transistor BT is provided between the memory cell transistors MT3 and MT4. A current path of the memory cell transistor MT7 on one end side of the serial connection is connected to one end of a current path of the selection transistor ST1, and the current path of a transistor MT0 on the other end side is connected to one end of a current path of the selection transistor ST2.

Gates of the respective selection transistors ST1 in the string units SU0 to SU(M−1) are connected to selection gate lines SGD0 to SGD(M−1) in common, and gates of the selection transistors ST2 in the same are connected to selection gate lines SGS0 to SGS(M−1) in common. On the other hand, control gates of the memory cell transistors MT0 to MT7 in the same block are connected to word lines WL0 to WL7 in common, and a control gate of the back-gate transistor BT is connected to, e.g., a back-gate line BG in common in accordance with each block.

That is, the word lines WL0 to WL7 and the back-gate line BG are connected in the string units SU0 to SU(L−1) in the same block in common, whereas the selection gate lines SGD and SGS are independent in accordance with each of the string units SU0 to SU(M−1) even in the same block.

Further, the other ends of the current paths of the selection transistors ST1 of the NAND strings 16 provided in the same row in the NAND strings 16 arranged in the matrix form in the memory cell array 2 are connected to any one of the bit lines BL (BL0 to BL(L−1)) in common. Furthermore, the bit line BL connects the NAND strings 16 in common over the blocks. Moreover, the other ends of the current paths of the selection transistors ST2 are connected to the source line SL in common. The source line SL connects the NAND strings 16 in common over the string units SU.

As described above, data in the memory cell transistors MT in the same block is collectively erased. On the other hand, a data read operation or a data write operation is collectively carried out with respect to the memory cell transistors MT connected to any word line WL in common in any string unit SU in any block. This unit is called a "page".

Figure 5:
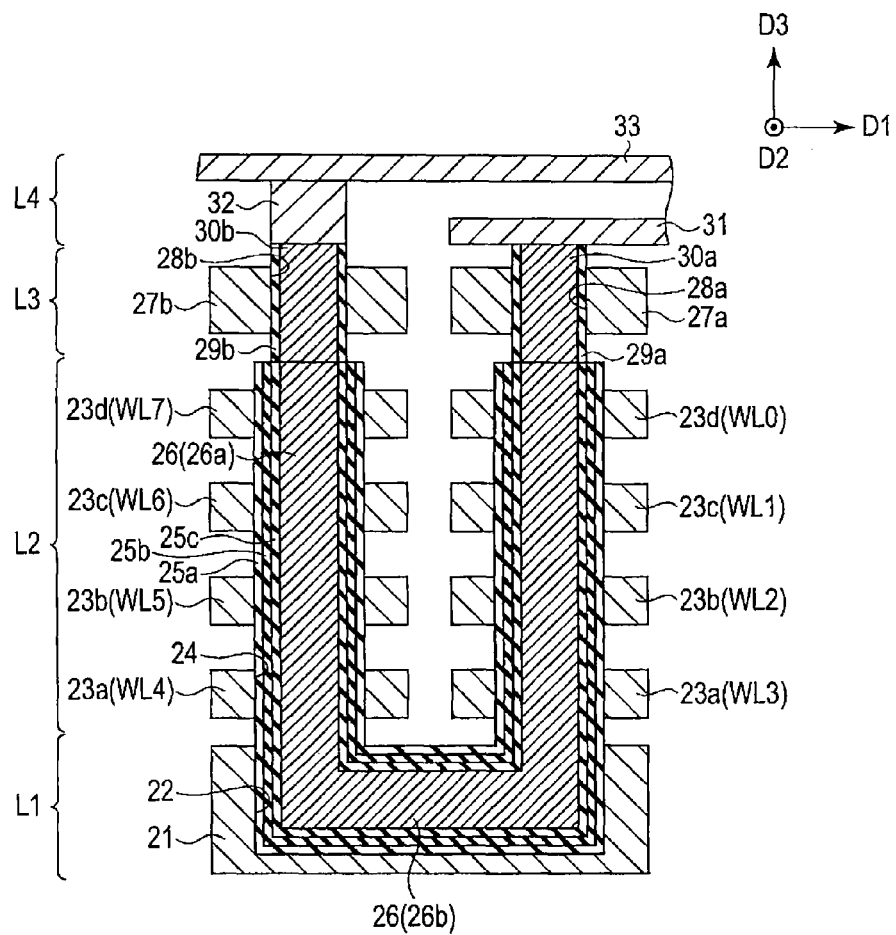

The three-dimensional stacked configuration of the memory cell array 2 will now be described with reference to FIG. 4 and FIG. 5. FIG. 4 and FIG. 5 are a perspective view and a cross-sectional view of the memory cell array 2.

As shown in the drawing, the memory cell array 2 is provided above a semiconductor substrate 20. That is, peripheral circuits, e.g., the sense amplifier 3, the page buffer 4, and others are formed on the semiconductor substrate 20, and the memory cell array 2 is formed above these peripheral circuits. Additionally, the memory cell array 2 has a back-gate transistor layer L1, a memory cell transistor layer L2, a selection transistor layer L3, and an interconnects layer L4 sequentially formed above the semiconductor substrate 20.

The back-gate transistor layer L1 functions as the back-gate transistor BT. The memory cell transistor layer L2 functions as the memory cell transistors MT0 to MT7 (the NAND string 16). The selection transistor layer L3 functions as the selection transistors ST1 and ST2. The interconnects layer L4 functions as the source lines SL and the bit lines BL.

The back-gate transistor layer L1 has a back-gate conductive layer 21. The back-gate conductive layer 21 is formed to two-dimensionally extend in a first direction and a second direction that are parallel to the semiconductor substrate 20 (that is, the first direction and the second direction are orthogonal to a third direction along which the memory cells are stacked). The back-gate conductive layer 21 is separated for each block. The back-gate conductive layer 21 is made of, e.g., polycrystal silicon. The back-gate conductive layer 21 functions as a back-gate line BG.

Further, the back-gate conductive layer 21 has a back-gate hole 22 as shown in FIG. 5. The back-gate hole 22 is made to scoop out the back-gate conductive layer 21. The back-gate hole 22 is made into an almost rectangular shape having a longitudinal direction in the first direction when viewed from the upper surface.

The memory cell transistor layer L2 is formed above the back-gate conductive layer L1. The memory cell transistor layer L2 includes word line conductive layers 23a to 23d. The word line conductive layers 23a to 23d are stacked with interlayer dielectric layers (not shown) being sandwiched between them. The word line conductive layers 23a to 23d are formed into a stripe shape extending along the second direction with a predetermined pitch in the first direction. The word line conductive layers 23a to 23d are made of, e.g., polycrystal silicon. The word line conductive layer 23a functions as control gates (word lines WL3 and WL4) of the memory cell transistors MT3 and MT4, the word line conductive layer 23b functions as control gates (word lines WL2 and WL5) of the memory cell transistors MT2 and MT5, the word line conductive layer 23c functions as control gates (word lines WL1 and WL6) of the memory cell transistors MT1 and MT6, and the word line conductive layer 23d functions as control gates (word lines WL0 and WL7) of the memory cell transistors MT0 and MT7.

Additionally, as shown in FIG. 5, the memory cell transistor layer L2 has a memory hole 24. The memory hole 24 is made to extend through the word line conductive layers 23a to 23d. The memory hole 24 is made to align with the vicinity of an end portion of the back-gate hole 22 in the first direction.

Further, as shown in FIG. 5, the back-gate transistor layer L1 and the memory cell transistor layer L2 have a block insulating layer 25a, an charge storage layer 25b, a tunnel insulating layer 25c, and a semiconductor layer 26. The semiconductor layer 26 functions as a body of the NAND string 16 (the back-gate of each transistor).

As shown in FIG. 5, the block insulating layer 25a is formed with a predetermined thickness on a sidewall facing the back-gate hole 22 and the memory hole 25. The charge storage layer 25b is formed with a predetermined thickness on a side surface of the block insulating layer 25a. The tunnel insulating layer 25c is formed with a predetermined thickness on a side surface of the charge storage layer 25b. The semiconductor layer 26 is formed in contact with a side surface of the tunnel insulating layer 25c. The semiconductor layer 26 is formed to fill the back-gate hole 22 and the memory hole 24.

The semiconductor layer 26 is formed into a U-like shape when viewed in the second direction. That is, the semiconductor layer 26 includes a pair of pillar portions 26a extending in a direction perpendicular to the surface of the semiconductor substrate 20 and a connecting portion 26b that connects the lower ends of the pair of pillar portions 26a.

The block insulating layer 25a and the tunnel insulating layer 25c are made of, e.g., a silicon oxide ($SiO_2$). The charge storage layer 25b is made of, e.g., a silicon nitride (SiN). The semiconductor layer 26 is made of polysilicon. The block insulating layer 25a, the charge storage layer 25b, the tunnel insulating layer 25c, and the semiconductor layer 26 form an MONOS type transistor that functions as a memory transistor MT.

In other words, the back-gate transistor layer L1 has the configuration that the tunnel insulating layer 25c is formed to surround the connecting portion 26b. The back-gate conductive layer 21 is formed to surround the connecting portion 26b.

Furthermore, in other words, the memory transistor layer L2 has the configuration that the tunnel insulating layer 25c is formed to surround the pillar portions 26a. The charge storage layer 25b is formed to surround the tunnel insulating layer 25c. The block insulating layer 25a is formed to surround the charge storage layer 25b. The word line conductive layers 23a to 23d are formed to surround the block insulating layers 25a to 25c and the pillar portions 26a.

As shown in FIG. 4 and FIG. 5, the selection transistor layer L3 includes conductive layers 27a and 27b. The conductive layers 27a and 27b are formed into a stripe shape extending along the second direction to have a predetermined pitch in the first direction. A pair of conductive layers 27a and a pair of conductive layers 27b are alternately arranged in the first direction. The conductive layer 27a is formed in an upper layer of one pillar portion 26a, and the conductive layer 27b is formed in an upper layer of the other pillar portion 26a.

The conductive layers 27a and 27b are made of polysilicon. The conductive layer 27a functions as the gate of the selection transistor ST2 (the select gate line SGS), and the conductive layer 27b functions as the gate of the selection transistor ST1 (the select gate line SGS).

As shown in FIG. 5, the selection transistor layer L3 has holes 28a and 28b. The holes 28a and 28b respectively extend through the conductive layers 27a and 27b. Moreover, the holes 28a and 28b are aligned with the memory holes 24.

As shown in FIG. 5, the selection transistor layer L3 includes gate insulating layers 29a and 29b and semiconductor layers 30a and 30b. The gate insulating layers 29a and 29b are formed on sidewalls facing the holes 28a and 28b, respectively. The semiconductor layers 30a and 30b are formed into a pillar shape extending in a direction perpendicular to the surface of the semiconductor substrate 20 so as to come in contact with the gate insulating layers 29a and 29b, respectively.

The gate insulating layers 29a and 29b are made of, e.g., a silicon oxide ($SiO_2$). The semiconductor layers 30a and 30b are made of, e.g., polysilicon.

In other words, the selection transistor layer L3 has the configuration that the gate insulating layer 29a is formed to surround the pillar semiconductor layer 30a. The conductive layer 27a is formed to surround the gate insulating layer 29a and the semiconductor layer 30a. Furthermore, the gate insulating layer 29b is formed to surround the pillar semiconductor layer 30b. The conductive layer 27b is formed to surround the gate insulating layer 29b and the semiconductor layer 30b.

As shown in FIG. 4 and FIG. 5, the interconnects layer L4 is formed above the selection transistor layer L3. The interconnects layer L4 includes a source line layer 31, a plug layer 32, and a bit line layer 33. The source line layer 31 is formed into a plate-like shape extending in the second direction. The source line layer 31 is formed to be in contact with upper surfaces of one pair of semiconductor layers 27a adjacent to each other in the first direction. The plug layer 32 is formed to be in contact with an upper surface of the semiconductor layer 27b and to extend in the direction perpendicular to the surface of the semiconductor substrate 20. The bit line layer 33 is formed into a stripe-like shape extending along the first direction with a predetermined pitch in the second direction. The bit line layer 33 is formed to be in contact with an upper surface of the plug layer 32. The source line layer 31, the plug layer 32, and the bit line layer 33 are made of a metal such as tungsten (W). The source line layer 31 functions as the source line SL explained in conjunction with FIG. 2 and FIG. 3, and the bit line layer 33 functions as the bit line BL.

1.1.2.3 Threshold Distribution of Memory Cell Transistor

Figure 6:
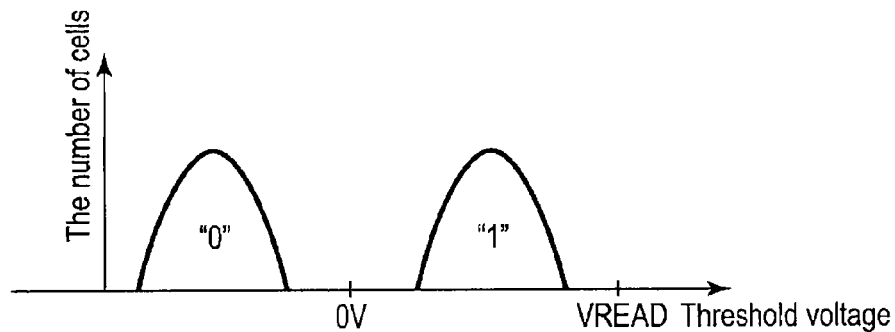
FIG. 6 is a graph showing a threshold distribution of a memory cell.

FIG. 6 shows a threshold distribution that can be taken by the memory cell transistor MT according to this embodiment.

As shown in the drawing, each memory cell transistor MT can hold 1-bit data "0" or "1" in accordance with its threshold value. The memory cell that holds data "0" is in, e.g., a state immediately after an erase operation or a state that a weak program is carried out and a high threshold value is set immediately after the erase operation. In the example of FIG. 6, although the threshold value corresponding to the data "0" is a negative value, it may have a positive value in some cases. The memory cell holding the data "1" has a higher threshold value than the data "0" since a charge is injected into the charge storage layer. Further, the definition of the data "0" and the data "1" may be opposite to that in FIG. 6. For example, in FIG. 6, data corresponding to a negative threshold value may be defined as data "1", and data corresponding to a positive threshold value may be defined as data "0". In this case, the data "0" and the data "1" in the following description of this specification can be read as data "1" and data "0", respectively.

Naturally, the memory cell 2 may have data which is 2 bits or more. Furthermore, a later-described voltage VREAD is a voltage higher than any threshold voltage that can be taken by the memory cell transistor MT. That is, the voltage VREAD is a voltage that enables turning on the memory cell transistor MT irrespective of held data.

1.2 Test Method of Semiconductor Memory Device

A test method of the semiconductor memory device according to this embodiment will now be described. This test method detects a short-circuit failure in the memory cell array 2, and is conducted before shipment of the NAND flash memory 200, for example.

1.2.1 Flow of Test Method

Figure 7:
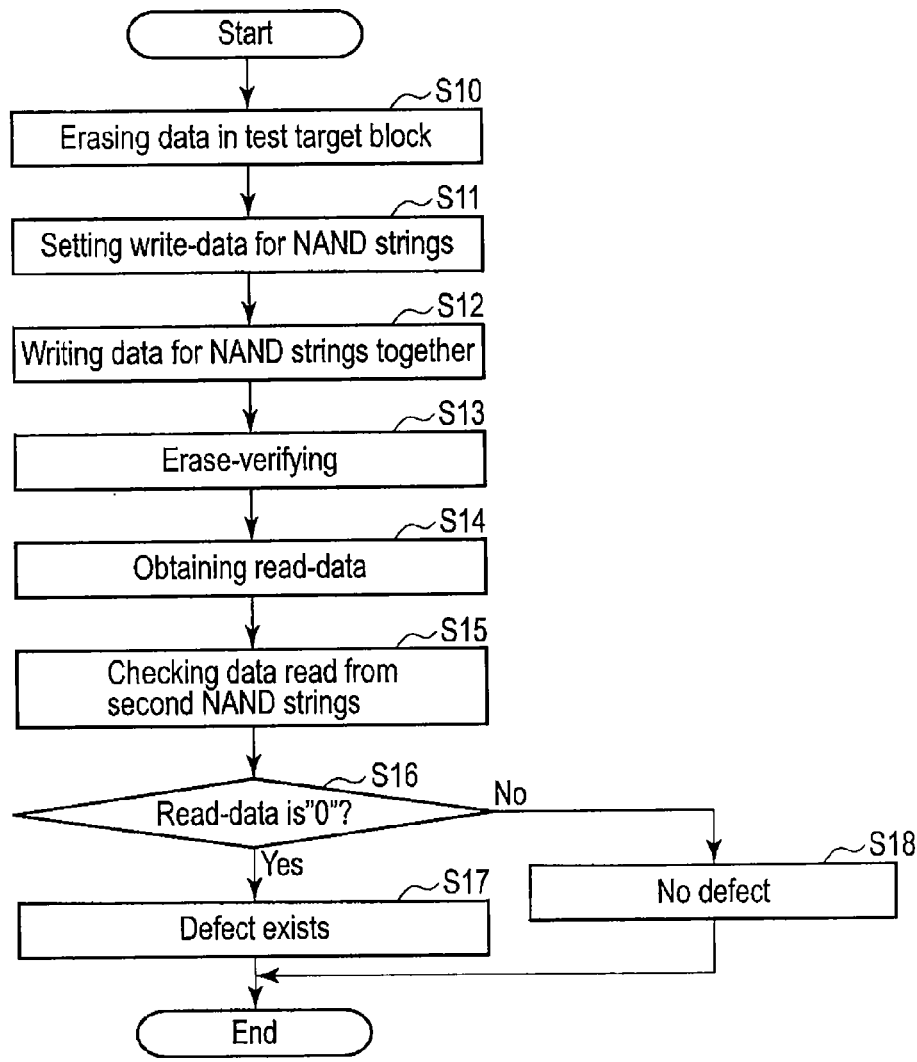
FIG. 7 is a flowchart of a test method according to the first embodiment.

The test method according to this embodiment will now be described with reference to FIG. 7. FIG. 7 is a flowchart showing a flow of processing of the test method. The processing in FIG. 7 is mainly executed by control of the sequencer 13.

First, for example, the CPU 330 of the controller 300 issues a test command to the NAND flash memory 200. In response to this command, the sequencer 13 starts a test.

The sequencer 13 first erases data in a test target block (a step S10). As a result, the data in the test target block all becomes data "0".

Figure 9:
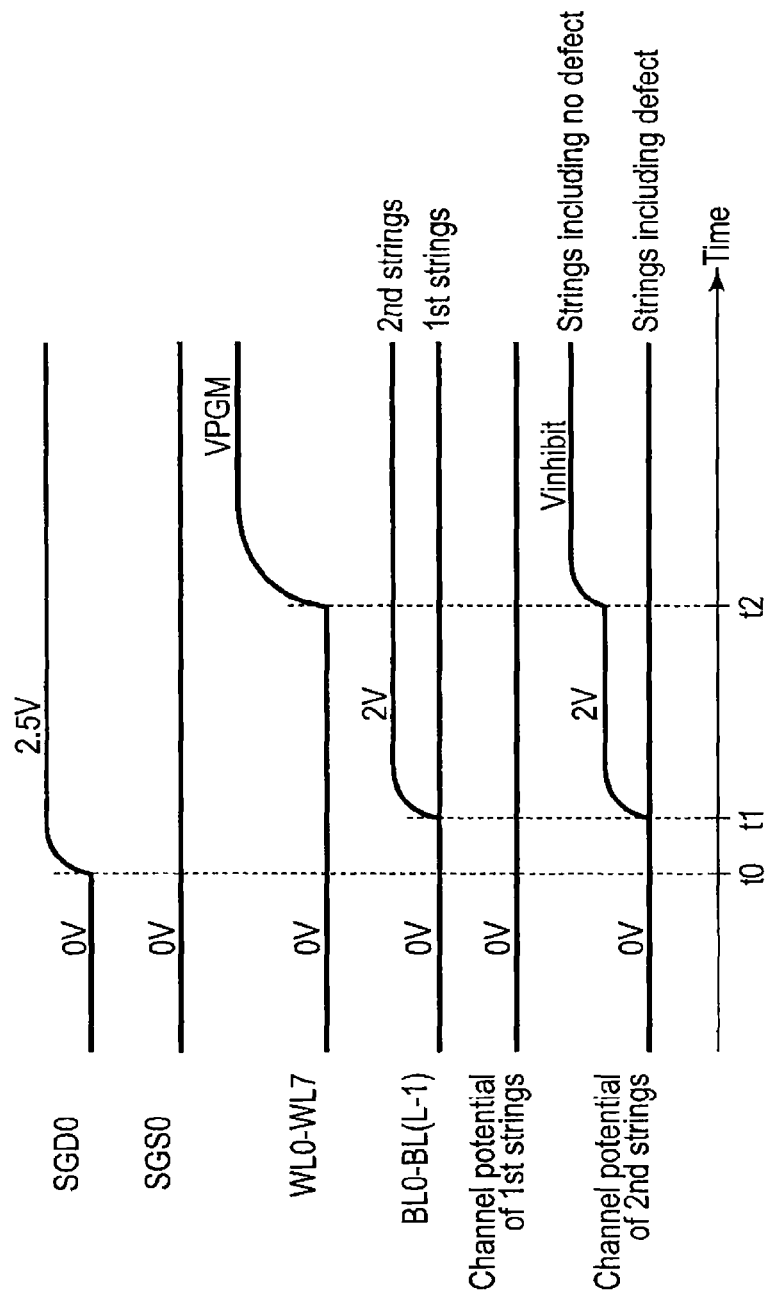
FIG. 9 is a timing chart showing signals of various interconnects in the test method according to the first embodiment.

Subsequently, the sequencer 13 generates write data for the NAND string 16 (a step S11) and collectively writes the data into all memory cell transistors MT in any string unit SU (a step S12). FIG. 8 and FIG. 9 show this state. FIG. 8 is a circuit diagram of the memory cell array 2 at the steps S11 and S12, and it shows a case where the string unit SU0 is selected. Moreover, FIG. 9 is a timing chart showing a voltage of each wiring line.

First, the sequencer 13 generates a data pattern "101010 . . . " as write data. That is, this data pattern is a pattern to write "1" into even-numbered bit lines BL0, BL2, BL4, . . . and write "0" into odd-numbered bit lines BL1, BL3, BL5, . . . . It is to be noted that the data pattern may be "010101 . . . ". In this case, the write data is opposite to the example shown in FIG. 8. The sequencer 13 transfers the data pattern to the page buffer 4. Additionally, the sequencer 13 instructs the row decoder 5 to execute a write operation with respect to all memory cell transistors MT in any string unit SU (SU2 in the following example).

Then, the row decoder 5 first applies a voltage VSGD to the select gate line SGD0 in the selected string unit SU0 (a time t0 in FIG. 9). The voltage VSGD is a voltage that turns on the selection transistor ST1 which transfers the data "1" but cuts off the selection transistor ST2 which transfers the data "0". Additionally, it is assumed that a source line driver that is omitted in FIG. 2 sets a potential in the source line SL0 to a positive voltage (e.g., 1 V). That is because the selection transistor ST2 on the source side can be assuredly turned off by utilizing a back-bias effect.

Subsequently, the sense amplifier 3 applies a voltage to the bit line BL based on the data pattern in the page buffer 4 (a time t1). That is, 0 V is applied to each even-numbered bit line BL into which the data "1" is to be written, and 2 V is applied to each odd-numbered bit line BL into which the data "0" is to be written. It is to be noted that the NAND string 16 connected to each even-numbered bit line BL may be referred to as a first string 16-1 and the NAND string 16 connected to each odd-numbered bit line BL may be referred to as a second string 16-2 hereinafter.

Further, the row decoder 5 applies a voltage VPGM to all the word lines WL0 to WL7 at a time t2. The voltage VPGM is a high voltage to inject a charge into the electric charge storage layer by Fowler-Nordheim (FN) tunneling to execute a program. Furthermore, the row decoder 5 applies a voltage VCG_BGV to the back-gate line BG. The voltage VCG-BGV is a voltage to turn on the back-gate transistor BT.

As a result, a channel potential in the first string 16-1 becomes 0 V. On the other hand, a channel potential in the second string 16-2 rises to a write inhibit voltage Vinhibit by coupling with the word lines WL. As a result, the data "1" is written into all the memory cell transistors MT in the first string 16-1, and the data "0" is written into all the memory cell transistors MT in the second string 16-2 (in other words, the write operation is inhibited).

Again referring to FIG. 7, a description will be continued. When the data write operation is completed as described above, the sequencer 13 executes an erase verify operation (a step S13). The erase verify operation is an operation for judging whether the threshold voltage of the memory cell transistor MT has been sufficiently lowered as a result of the erase operation. FIG. 10 shows this state. FIG. 10 is a circuit diagram of the memory cell array 2 at the step S13.

As shown in the drawing, the row decoder 5 applies a voltage VSG to the select gate lines SGD0 and SGS0 in response to a command from the sequencer 13. The voltage VSG is a voltage to turn on the selection transistors ST1 and ST2. Further, the row decoder 5 applies a voltage VEVFY to all the word lines WL0 to WL7. The voltage VEVFY is a voltage that turns on each memory cell transistor MT whose threshold value has lowered to a desired value by an erase operation and that turns off each memory cell transistor MT whose threshold value has not sufficiently lowered. In the example of the threshold distribution in FIG. 6, VEVFY=0 V. Moreover, the row decoder 5 applies a voltage VCG_BGV to the back-gate line BG.

Additionally, the source line driver applies 2 V to the source line SL0 in response to a command from the sequencer 13.

Further, the sense amplifier 3 senses and amplifies data read to each bit line BL and returns a result of this operation to the sequencer 13 (a step S14). Then, the sequencer 13 checks the data read from the second string 16-2 (a step S15). The NAND string 16 checked at this step is the NAND string into which the data "0" was written at the step S12, i.e., the write-inhibited NAND string 16.

As a result of the step S15, if the data read from any NAND string 16-2 is "1" (a step S16, YES), the sequencer 13 determines that the NAND string 16 has a defect (a short-circuit failure of a memory hole) (a step S17). On the other hand, if the read data is "0" (the step S16, NO), the sequencer 13 determines that the NAND string 16 does not have a defect (a step S18).

Then, the sequencer 13 stores a test result in any register in the NAND flash memory 200 or informs the controller 300 of the test result. The controller 300 manages a defect position based on the obtained test result. That is, the controller 300 treats the defect position as a column failure and remedies the position by redundancy technology, or determines it as a bad string or a bad block to be treated as an unusable region.

1.2.2 Specific Example of Test, Part 1 (No Short-circuit Failure)

A specific example of the test will now be described in detail. A case where no short-circuit failure is present will be first explained with reference to FIG. 11. FIG. 11 is a circuit diagram of the memory cell array 2, and it shows a state that a write operation is collectively executed with respect to all memory cell transistors MT in the selection string unit SU0 at the step S12. To simplify the explanation, attention will be paid to the three bit lines BL0 to BL2 alone in the following description.

As shown in the drawing, since 0 V is applied to the even-numbered bit lines BL0 and BL2, the selection transistor ST1 is turned on in the first string 16-1. Therefore, 0 V is transferred to the channel of the first string 16-1. As a result, charges are injected into the electric charge storage layers of all the memory cell transistors MT in the first string 16-1, threshold values are increased, and the data "1" is written.

On the other hand, since 2 V is applied to the odd-numbered bit line BL1, the selection transistor ST2 is cut off in the second string 16-2. Therefore, the channel of the second string 16-2 is electrically floating. Further, a potential in the channel is raised by capacitive coupling with each word line WL. Therefore, a potential difference between the word line WL and the channel is reduced. Consequently, injection of the charges into the electric charge storage layers of all the memory cell transistors in the second string 16-2 is suppressed, and the data "0" is written (in other words, the data "0" is maintained). A technique that raises the potential in the channel by the coupling in this manner is known as self-boost technology.

In the case of FIG. 11, data is normally written into the respective strings 16-1 and 16-2. When the erase verify operation is performed at the step S13, each memory cell transistor MT is turned on in the second string 16-2, and a current path reaching to the bit line BL from the source line SL is formed in the second string 16-2. As a result, the data "0" is read out from the second string 16-2 (a step S16, NO). Therefore, it is determined that there is no short-circuit defect (a step S18). More specifically, a potential that is dependent on the memory cell transistor MT having the highest threshold value appears in the bit line in the NAND string. This potential appears in the bit line if it has a positive value, or a potential corresponding to an absolute value appears if this potential has a negative value.

1.2.3 Specific Example of Test, Part 3 (with Short-circuit Failure)

A case where a short-circuit failure is present will now be described with reference to FIG. 12. FIG. 12 is a circuit diagram of the memory cell array 2 and associated with FIG. 11. A difference from FIG. 11 lies in that a memory hole of the second string 16-2 short-circuits with a memory hole of at least any one of two adjacent first strings 16-1. This short-circuit failure is represented as a resistance element surrounded by a circle of a broken line with an additional remark "MH short" in FIG. 12.

In the case of writing data at the step S12, a normal write operation can be performed with respect to the first string 16-1. However, an erroneous write operation is carried out with respect to the second sting 16-2.

In the second string 16-2, as described with reference to FIG. 11, the channel potential is raised by self-boost, and an increase in threshold value must be suppressed by this boost. However, when the memory hole of the second string 16-2 short-circuits with the memory hole of the first string 16-1 connected with, e.g., the bit line BL0, 0 V is transferred from the memory hole of this first string 16-1. This transfer also occurs when the same short-circuits with the memory hole of the first string 16-1 connected to the bit line BL2. That is, the channel potential in the second string 16-2 is 0 V. As a result, even though the selection transistor ST1 is cut off in the second string 16-2, a charge is injected into the electric charge-storage layer of at least one memory cell transistor MT in the second string 16-2, and the data "1" is written. It is to be noted that the number of the memory cell transistors MT into which the data "1" is erroneously written in the second string 16-2 is dependent on a level of the short-circuit failure. For example, in the case of a slight short-circuit failure, since the 0 V transfer capability is low, data may be erroneously written into the memory cell transistor MT near the short-circuit failure alone. Alternatively, in the case of a serious short-circuit failure, data may be erroneously written into all of the eight memory cell transistors MT in the second string 16-2.

Therefore, at the time of performing the erase verify operation at the step S13, at least one memory cell transistor MT into which data was erroneously written is turned off in the second string 16-2, and a current path reaching the bit line BL from the source line SL is not formed in the second string 16-2. As a result, the data "1" is read out from the second string 16-2 (a step S16, YES). Therefore, it is determined that the short circuit failure is present (a step S17).

1.3 Effect According to this Embodiment

With the configuration according to this embodiment, a speed of the test operation in the semiconductor memory device can be raised, and a test cost can be reduced. This effect will now be described hereinafter.

As one of defects that can be produced in the NAND flash memory, there is a short-circuit failure between NAND strings adjacent to each other. To detect presence/absence of this failure, a test data pattern must be written into each of all the word lines after erasing the data, then this pattern must be read out, and data collation must be carried out with the written data pattern being used as an expectation value.

However, according to this technique, a test time is long, and a test cost increases as a memory capacity is raised. Furthermore, according to this technique, even though presence/absence of a defect can be detected, a cause of the defect (e.g., a short-circuit failure in the NAND string) cannot be designated.

Figure 13:
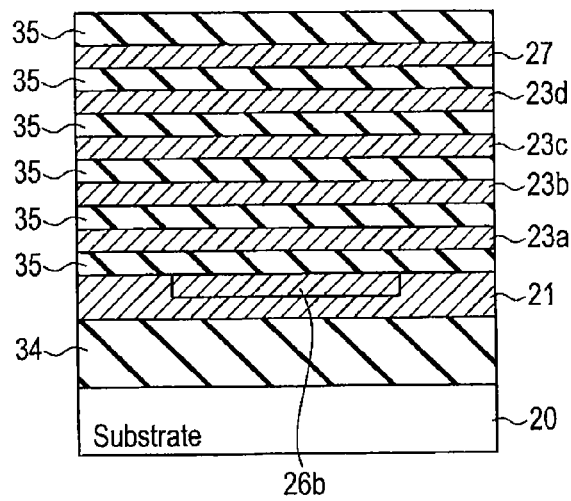
FIG. 13 to FIG. 15 are cross-sectional views sequentially showing part of a manufacturing process of the memory cell array.
Figure 14:
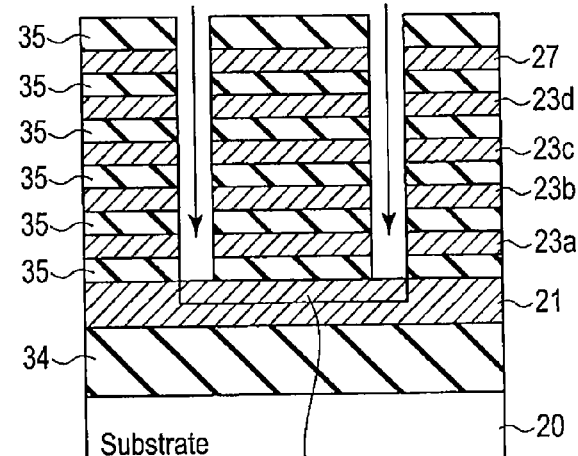
Figure 15:
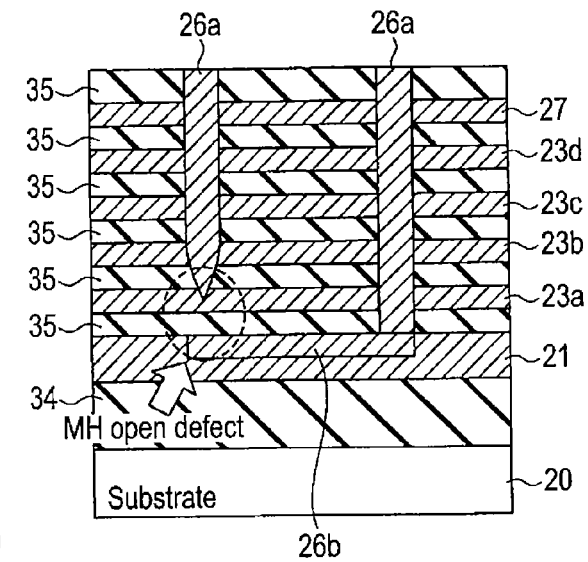

Moreover, in the case of such a three-dimensional NAND flash memory as described with reference to FIG. 4 and FIG. 5, a defect is apt to be produced in the memory cell array because of its structure. A typical example of this defect is an open failure of the memory hole (an MH open failure). The MH open failure will now be described with reference to FIG. 13 to FIG. 15. FIG. 13 to FIG. 15 show part of a manufacturing process of the memory cell array 2.

First, as shown in FIG. 13, peripheral circuits are formed on the semiconductor substrate 20, and then an interlayer insulating film 34 is formed to cover the peripheral circuits. Subsequently, the back-gate line layer 21 and the semiconductor layer 26b are formed on the interlayer insulating film 34. Further, an interlayer insulating film 35 and the semiconductor layers 23a to 23d are alternately formed on the back-gate line layer 21 and the semiconductor layer 26b.

Then, as shown in FIG. 14, each hole (a memory hole) that is pierced in the interlayer insulating film 35 and the semiconductor layers 23a to 23d and reaches the semiconductor layer 26b is made. The charge storage layer, the block layer, and the gate insulating film are formed on a sidewall of the memory hole, and then the hole is filled with a semiconductor layer 26a.

However, as the number of the semiconductor layers 23a to 23d increases, the memory hole becomes deeper. Then, forming the memory hole at a depth reaching the semiconductor layer 26b is difficult. FIG. 15 shows this state. As shown in the drawing, when the memory hole does not reach the semiconductor layer 26a, the semiconductor layers 26a and 26b are separated from each other, which is the MH open failure.

When the MH open failure occurs, a cell current does not flow through the NAND string 16, irrespective of data held in the memory cell transistor. Therefore, the read is always determined as the data "1" (a threshold value is high, and the memory cell transistor is OFF).

On the other hand, when avoiding this MH open failure is tried, a short-circuit failure of the memory hole (an MH short failure) is apt to occur. The MH short failure is a failure that memory holes adjacent to each other electrically short-circuit.

That is, to avoid the MH open failure, each memory hole having a sufficient depth must be formed. Therefore, a diameter of each memory hole must be increased. However, when the diameter of each memory hole is too large, an adjacent memory hole is connected to this memory hole, and the memory holes short-circuit.

FIG. 16 is a plan view of the word lines, and the following three types of MH short failures can occur. That is, Case I: a short-circuit failure of memory holes adjacent to each other in a direction (the second direction explained in FIG. 3 and FIG. 4) orthogonal to each bit line BL.

Case II: a short-circuit failure of memory holes that are adjacent to each other in a direction (the first direction described in conjunction with FIG. 3 and FIG. 4) orthogonal to each bit line BL and that belong to different string units SU.

Case III: a short-circuit failure of memory holes that are adjacent to each other in a direction (the first direction described in conjunction with FIG. 3 and FIG. 4) orthogonal to each bit line BL and that belong to the same string unit SU.

In this embodiment, a failure of Case I is detected (Cases II and III will be described in third and subsequent embodiments).

That is, at the time of a test, data in a block is erased, and then a write operation is collectively executed with respect to all memory cell transistors MT in the selected string unit SU. The data used in this case is the same with respect to all the memory cell transistors MT in the NAND string, and it is a pattern that "0" and "1" alternately appear in a page direction. That is, it is a pattern "01010101 . . ." or "10101010 . . .".

Furthermore, after the write operation, the erase verify operation is carried out. If there is an MH short failure of Case I, the data "1" must be read from the NAND string 16 into which the data "0" should have been written. That is because, when the above-described write pattern is used, at least two NAND strings 16 which short-circuit is a pair of the NAND string 16 into which the data "0" should be necessarily written and the NAND string 16 into which the data "1" should be written, and boosting the channel potential by self-boost is consequently difficult.

Moreover, according to this technique, data read from the NAND string 16 (the second string 16-2) into which the data "0" should be written is confirmed. In the second string 16-2, if all the memory cell transistors MT0 to MT7 hold the data "0", i.e., a value less than 0 V, the sense amplifier 3 determines that the read data is "0". On the other hand, when a threshold voltage of at least one memory cell transistor MT has the data "1", i.e., a value exceeding 0 V, the sense amplifier 3 determines that the read data is "1".

That is, if a threshold value of at least one memory cell transistor MT is boosted by the MH short failure, the sense amplifier 3 determines that the read data is "1". Therefore, the data does not have to read out while sequentially selecting all the word lines WL, and executing the erase verify operation just once enables completing the processing of the steps S13 to S14. Therefore, the test operation can be accelerated, and the test cost can be reduced.

It is to be noted that, at the step S12, the write operation may be carried out with respect to the memory cell transistor MT connected to any one word line WL in place of all the memory cell transistors MT in the selected string unit SU. That is, the write operation can be carried out in pages. In this case, a defect can be detected. However, according to this method, when the write operation cannot be performed due to a failure of the memory cell transistor MT itself, a situation where the write operation cannot be performed due to absence of the MH short failure cannot be distinguished from a situation where the write operation cannot be performed due to a failure of the memory cell transistor MT in a result obtained at the steps S13 to S14. However, according to the method of performing the write operation relative to all the memory cell transistors MT, even if a memory cell transistor MT into which data cannot be written due to the failure is included, the step S13 enables detecting that the erroneous write operation is carried out with respect to at least one memory cell transistor MT belonging to this NAND string 16 due to an MH sort failure.

2. Second Embodiment

A semiconductor memory device according to the second embodiment will now be described. This embodiment relates to a method of identifying a position of an MH short failure by repeating the test explained in the first embodiment twice. A difference from the first embodiment alone will be described hereinafter.

2.1 Test Method

A test method according to this embodiment will now be described with reference to FIG. 17. FIG. 17 is a flowchart showing a flow of processing of the test method. The processing in FIG. 17 is mainly executed under control of the sequencer 13.

First, the processing of the step S10 explained in conjunction with FIG. 7 is executed. Then, the sequencer 13 generates a first data pattern (a step S20). The first data pattern is, e.g., a pattern configured to write "1" into the even-numbered bit lines BL0, BL2, BL4, . . . and write "0" into the odd-numbered bit lines BL1, BL3, BL5, . . . as explained in the first embodiment. Specifically, it is a data pattern "10101010 . . .". Of course, it may be a data pattern which is an opposite pattern "01010101 . . .".

Moreover, the step S12 is executed, the data is collectively written into all the memory cell transistors MT, and then the erase verify operation is executed at the step S13.

The sequencer 13 transmits a read data pattern D1 obtained at the step S13 to the controller 30 (a step S21). The CPU 330 of the controller 300 holds the received data pattern D1 in, e.g., a RAM 320.

Thus, the first test is completed. Subsequently, the sequencer 13 executes a second test. That is, the sequencer 13 first erases data in a block (a step S22) and generates a second data pattern (a step S23). The second data pattern is complementary data of the first data pattern. For example, if the first data pattern is "10101010 . . .", the second data pattern is "01010101 . . .". The opposite situation is also possible.

Additionally, the sequencer 13 collectively writes the data into all the memory cell transistors MT based on the second data pattern (a step S24), and then the sequencer 13 executes the erase verify operation (a step S25). Particulars of the steps S24 and S25 are the same as the steps 12 and S13.

Subsequently, the sequencer 13 transmits the read data pattern D2 obtained at the step S25 to the controller 300 (a step S26). The CPU 330 of the controller 300 holds the received data pattern D2 in, e.g., the RAM 320.

With the above-described operation, the second test is completed. Subsequent operations are carried out by, e.g., the CPU 330 of the controller 300. First, the CPU 330 combines the received data patterns D1 and D2 (a step S27). As an example of combination, the CPU 330 executes a logical AND operation of the data patterns D1 and D2. Further, the CPU 330 compares a result of the operation obtained at the step S27 with an expectation value (a step S28). In this example, the expectation value is a value based on the first data pattern and the second data pattern. For example, if the combination at the step S27 is the logical AND operation, the expectation value is a logical AND operation result of the first data pattern and the second data pattern. The expectation value in this case is a data pattern in which all bits are "0".

As a result of the comparison, if the arithmetic result and the expectation value coincide with each other (a step S29, YES), the CPU 330 determines that an MH short failure is not present (a step S30). On the other hand, if both members do not coincide with each other, it is determined that the corresponding bit lines BL have an MH short failure (a step S31). Furthermore, the CPU 330 registers the string units SU in which the MH short failures have occurred as defective strings. The registered string unit SU may be replaced by another normal string unit SU based on, e.g., redundancy technology, or a block including the defective string may be treated as a bad block (an unusable block).

2.2 Specific Example of Test Method

Figure 18:
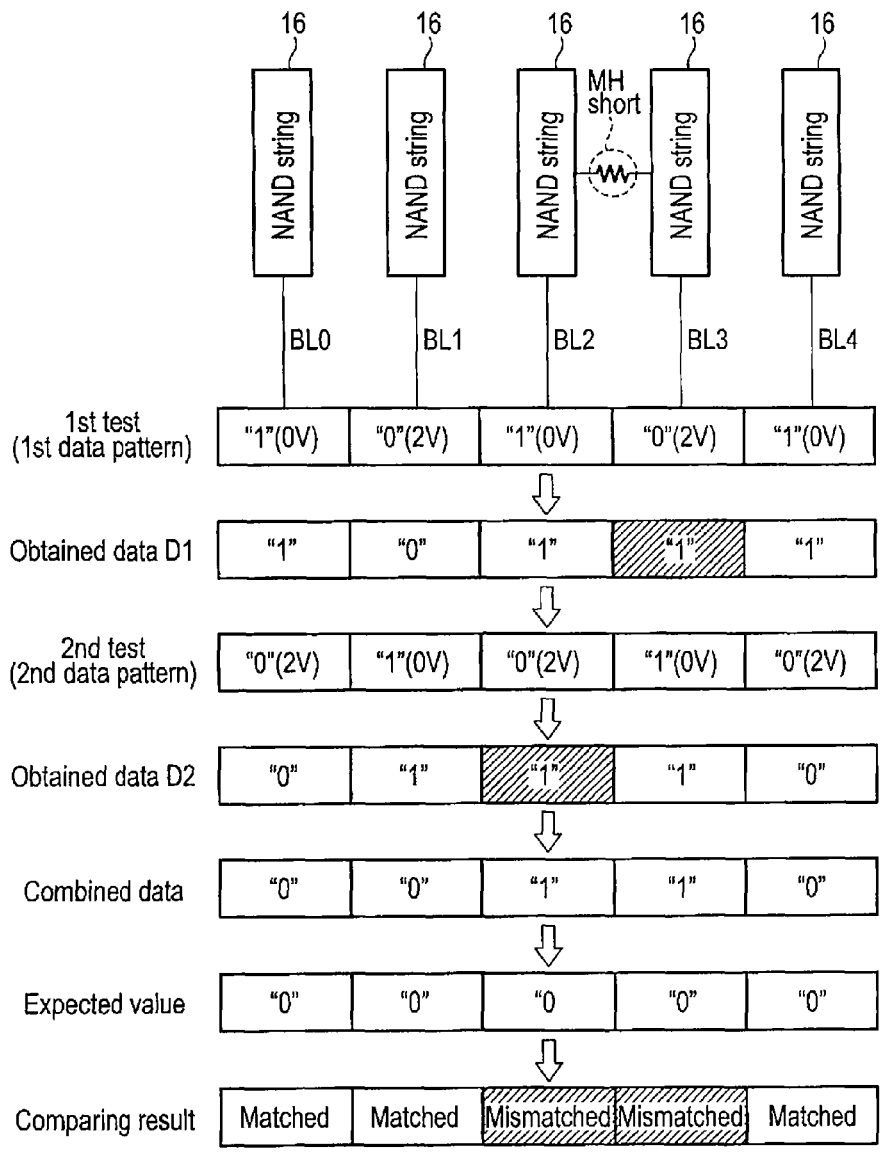
FIG. 18 is a conceptual view showing a test method according to the second embodiment.

A specific example of the test method according to this embodiment will now be described with reference to FIG. 18. FIG. 18 is a schematic view showing the concept of the test method, and it sequentially shows data patterns obtained at the respective steps in FIG. 17. To simplify the explanation, a description will be given on an example where the number of the bit lines BL is 5 (BL0 to BL4) and an MH short failure is present between the NAND string 16 connected to the bit line BL2 and the NAND string connected to the bit line BL3.

As shown in the drawing, first, the sequencer 13 generates a first data pattern and executes a first test. The first data pattern is "10101" (the step S20 or S12). Further, the data pattern D1 obtained by the erase verify operation is "10111" (the step S13 or S21). The reason why the fourth bit from the top is not "0" but "1" is that the self-boost cannot be carried out in the NAND string 16 of the bit line BL3 due to presence of the MH short failure and "1" was erroneously written (i.e., a threshold value was increased). This data pattern D1="10111" is transmitted to the controller 300.

Subsequently, the sequencer 13 generates a second data pattern and executes a second test. The second test pattern is "01010" (the step S23 or S24). Furthermore, the data pattern D2 obtained by the erase verify operation is "01110" (the step S25 or S26). The reason why the third bit from the top is not "0" but "1" is that the self-boost cannot be carried out in the NAND string 16 of the bit line BL2 due to presence of the MH short failure. This data pattern D2="01110" is transmitted to the controller 300.

The CPU 330 of the controller 300 performs a logical AND operation in accordance with each bit by using the data pattern D1="10111" and the data pattern D2="01110" (the step S27). A result of the operation is "00110". Moreover, the CPU 330 compares the result of the operation with an expectation value (the step S28). The expectation value is "00000". Then, the third bit and the fourth bit from the top do not coincide with each other. Thus, the CPU 330 can grasp that the MH short failure is present between the NAND strings 16 connected to the bit line BL2 and the bit line BL3 associated with these bits.

2.3 Effect According to this Modification

With the configuration according to this embodiment, the bit line BL as the write target is changed, and the test operation is carried out twice. Therefore, it is possible to detect not only information indicating whether an MH short failure is present but also information indicating which NAND string 16 has an MH short failure occurring therein. Therefore, a test accuracy can be further improved as compared with the first embodiment.

It is to be noted that the description has been given as to the example where the processing of the steps S27 to S29 is executed by the controller 300 in this embodiment. However, the sequencer 13 may execute this processing. Additionally, in this embodiment, although the description has been given as to the example where the first string 16-1 is first selected and then the second string 16-2 is selected, the order may be reversed.

3. Third Embodiment

A semiconductor memory device according to a third embodiment will now be described. This embodiment concerns a method of detecting not only a failure of Case I but also a failure of Case II described in the first embodiment with reference to FIG. 16. A difference from the first embodiment alone will be described below.

3.1 Configuration of Sense Amplifier

Figure 19:
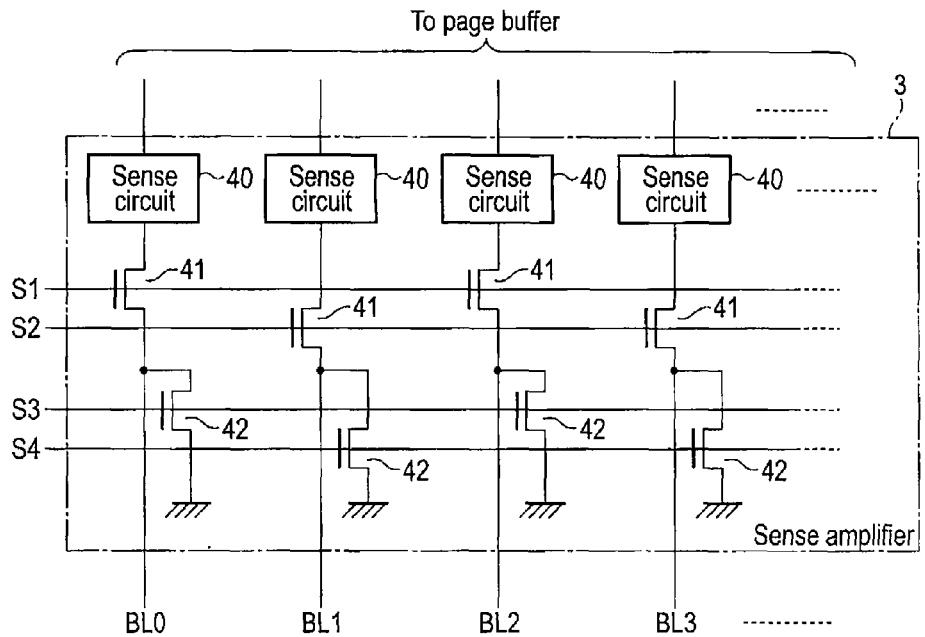
FIG. 19 is a circuit diagram of a sense amplifier according to a third embodiment.

FIG. 19 shows an example of a circuit diagram of a sense amplifier 3 according to this embodiment. As shown in the drawing, the sense amplifier 3 comprises sense circuits 40 and n-channel MOS transistors 41 and 42 associated with bit lines BL.

One end of a current path of the transistor 41 is connected to a corresponding bit line BL, and the other end of the same is connected to a corresponding sense circuit 40. That is, the transistor 41 functions as a switch that connects the bit line BL with the sense circuit 40.

One end of a current path of the transistor 42 is connected to a corresponding bit line BL, and the other end of the same is grounded. That is, the transistor 42 functions as a switch that connects the bit line BL with a ground node.

Further, a gate of each transistor 41 associated with each even-numbered bit line EL is connected to a signal line S1 in common. A gate of each transistor 41 associated with each odd-numbered bit line BL is connected to a signal line S2 in common. A gate of each transistor 42 associated with each even-numbered bit line EL is connected to a signal line S3 in common. A gate of each transistor 42 associated with each odd-numbered bit line BL is connected to a signal line S4 in common. The signal lines S1 to S4 are controlled by, e.g., the sequencer 13, and the signal lines S1 and S2 are set to an "H" level whilst the signal lines S3 and S4 are set to an "L" level at the time of regular write and read operations.

At the time of a read operation, the sense circuit 40 reads out data from a corresponding bit line BL through the transistor 41 and senses and amplifies this data. Furthermore, at the time of a write operation, the sense circuit 40 transfers a voltage associated with write data to a corresponding bit line BL.

3.2 Test Method of Semiconductor Memory Device

Figure 20:
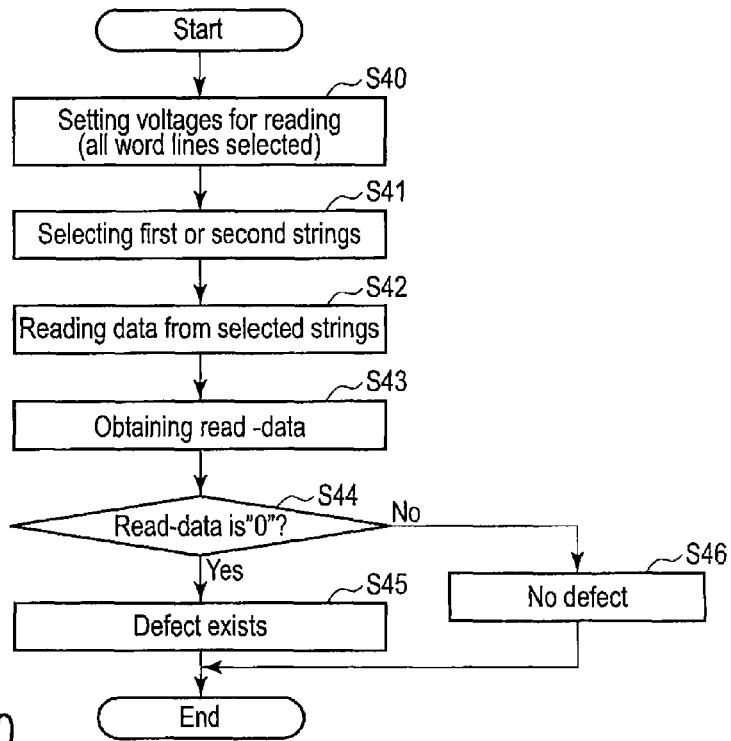
FIG. 20 is a flowchart of a test method according to the third embodiment.

A test method according to this embodiment will now be described with reference to FIG. 20. FIG. 20 is a flowchart showing a flow of processing of the test method. The processing in FIG. 20 is mainly executed under control of a sequencer 13.

First, for example, a controller 300 issues a test command with respect to an NAND flash memory 200. In response to this, the sequencer 13 starts the test.

The sequencer 13 first instructs voltage generation circuits 11 and 12 and a row decoder 5 to generate a voltage required for reading data and to apply the voltage to each wiring line (a step S40). Furthermore, the sequencer 13 controls control signals S1 to S4, selects one of a first string 16-1 and a second string 16-2, connects the selected one to the sense circuit 40, and grounds the unselected one (a step S41). Moreover, the sense circuit 40 reads data from the selected NAND string 16 (a step S42).

FIG. 21 and FIG. 22 show a state of the steps S40 to S42. FIG. 21 is a circuit diagram of the memory cell array 2 at the steps S40 to S42, and it shows a case where a string unit SU2 is selected and each even-numbered bit line BL (the first string 16-1) is selected. Moreover, FIG. 22 is a timing chart showing a voltage of each wiring line.

First, based on a row address supplied from the sequencer 13, the row decoder 5 applies a voltage VSG (e.g., 4 V) to a select gate line SGD2 of a selected string unit SU2. A select gate line SGS is set to 0 V. As a result, in the selected string unit SU2, a selection transistor ST1 is turned on, and a selection transistor ST2 is turned off. Additionally, the row decoder 5 also applies the voltage VSG to select gate lines SGS1 and SGS3 of unselected string units SU1 and SU3 adjacent to the selected string unit SU2. As a result, in each of the unselected string units SU1 and SU3, the selection transistor ST2 is turned on, and the selected transistor ST1 is turned off.

Subsequently, the row decoder 5 applies a voltage VREAD to all of word lines WL0 to WL7. As a result, in the selected string unit SU2, all memory cell transistors MT are turned on. Further, the row decoder 5 applies a voltage VCG_BGV to a back-gate line BG. As a result, a back-gate transistor BT is turned on.

Then, the sequencer 13 sets the signal lines S1 and S4 to the "H" level and sets the signal lines S2 and S3 to the "L" level. As a result, each even-numbered bit line BL is connected to the sense circuit 40 by the transistor 41, and each odd-numbered bit line BL is grounded by the transistor 42. It is to be noted that, when each odd-numbered bit line BL is selected, the signal lines S2 and S3 are set to the "H" level, and the signal lines S1 and S4 are set to the "L" level.

Again referring to FIG. 20, the description will be continued. The sequencer 13 receives a sense result obtained by the sense circuit 40 (a step S43) and judges whether the read data is "0" (a step S44). If the read data is "0", i.e., if a potential in the bit line BL is sufficiently low (the step S44, YES), the sequencer 13 determines that an MH short failure has occurred in the NAND string 16 associated with this bit line BL (a step S45). On the other hand, if the read data is "1" (the step S44, NO), the sequencer 13 determines that there is no MH short failure (a step S46).

Thereafter, like the first embodiment, the sequencer 13 stores a test result in any register in the NAND flash memory 20 or informs the controller 300 of the test result.

3.3 Specific Example of Test, Part 1 (Failure of Case I)

A specific example of the details of the test will now be described hereinafter. A description will be first given as to a failure of Case I, i.e., an MH short failure in a direction along the word lines WL.

Figure 23:
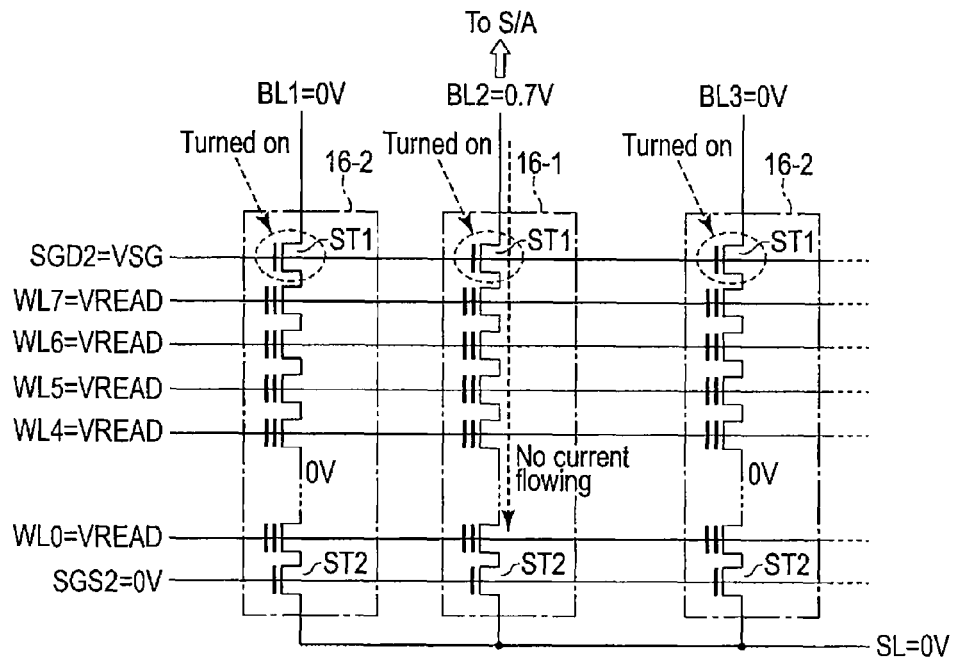

A case where there is no failure of Case I will be first described with reference to FIG. 23. FIG. 23 is a circuit diagram of the memory cell array 2, and it shows a state of the selected string unit SU2 at the time of executing the step S23. To simplify the description, attention will be paid to three bit lines BL0 to BL2 alone and a case where the even-numbered bit line BL2 (the first string 16-1) is selected will be explained hereinafter.

As shown in the drawing, the bit line BL2 is connected to the sense circuit 40, and the bit line BL2 is precharged to, e.g., 0.7 V by the sense circuit 40. In the selected string 16-1, the selection transistor ST2 is in an OFF state. Therefore, a current path is not formed to the bit line BL2, and a current does not flow through the bit line BL2. Therefore, a potential of approximately 0.7 V is maintained in the bit line BL2, and the sense circuit 40 determines that read data is "1" (the step S44, NO). As a result, the sequencer 13 determines that there is no short-circuit defect (a step S46).

Figure 24:
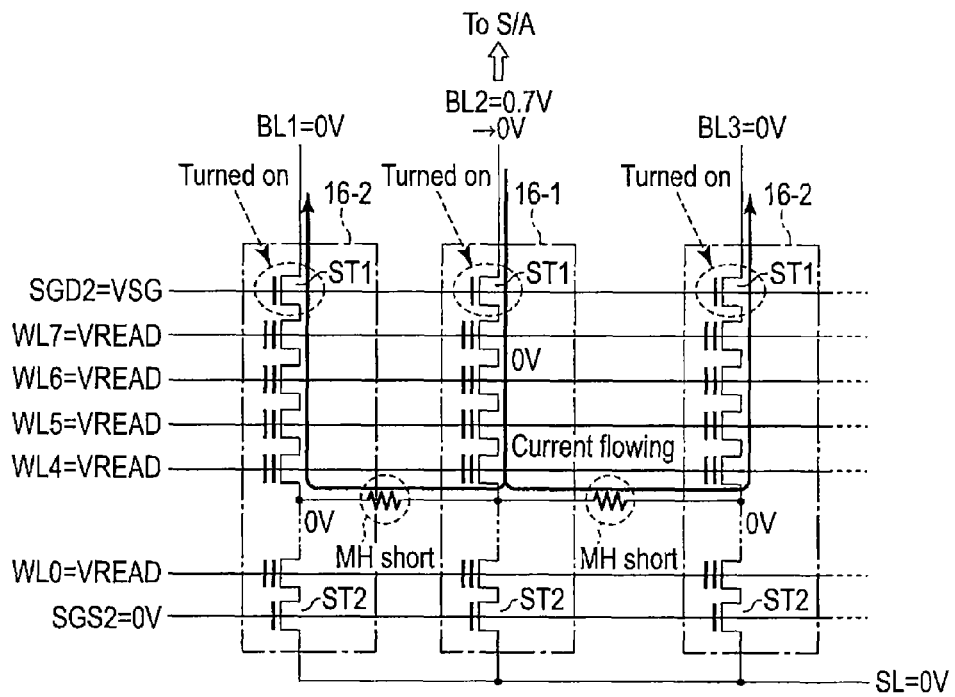

FIG. 24 shows a case where there is a failure of Case I. As shown in FIG. 24, a memory hole of the first string 16-1 short-circuits with a memory hole of at least one of two adjacent second strings 16-2.

In this case, since the bit lines BL1 and BL3 are grounded, a current path that reaches the bit line BL1 or BL3 from the bit line BL2 through the MH short failure is formed. Therefore, the potential in the bit line BL2 is lowered to approximately 0 V, and the sense circuit 40 determines that the read data is "0" (the step S44, YES). As a result, the sequencer 13 determines that the short-circuit defect is present (the step S45).

3.4 Specific Example of Test, Part 2 (Failure of Case II)

A failure of Case II, i.e., an MH short failure between string units that are adjacent to each other in a direction parallel to the bit lines BL will now be described.

A description will be first given as to a case where there is no failure of Case II with reference to FIG. 25. FIG. 25 is a circuit diagram of the memory cell array 2, and it shows a state of the string units SU1 to SU3 at the time of executing the step S23. Furthermore, FIG. 25 shows the selected even-numbered bit line BL2 (the first string 16-1) alone in the string units SU1 to SU3.

As shown in the drawing, the bit line BL2 is connected to the sense circuit 40, and the bit line BL2 is precharged to, e.g., 0.7 V by the sense circuit 40. If there is no MH short failure, a current path is not formed to the bit line BL2 as described above with reference to FIG. 23, and a current does not flow through the bit line BL2.

FIG. 26 shows a case where a failure of Case II is present. As shown in FIG. 26, a memory hole of the first string 16-1 of the selected string SU2 short-circuits with a memory hole of at least any one of the first strings 16-1 of adjacent unselected string units SU1 and S3.

Further, a voltage VSG is applied to the select gate lines SGS1 and SGS3, and the selection transistors ST2 of the unselected string units SU1 and SU3 are in an ON state. Therefore, a current path reaching the source line SL (=0 V) from the bit line BL2 through an MH short failure is formed. Therefore, a potential in the bit line BL2 is lowered to approximately 0 V, and the sense circuit 40 determines that the read data is "0" (the step S44, YES). As a result, the sequencer 13 determines that a short-circuit defect is present (the step S45).

3.5 Effect According to this Embodiment

With the configuration according to this embodiment, the test can be substantially executed by the data read operation alone. Therefore, the speed of the test operation of the semiconductor memory device can be increased.

Furthermore, in this embodiment, since data is not written, a high voltage VPGM does not have to be used. Moreover, since a channel potential in the NAND string 16 does not rise much as compared with the first and second embodiments, the potential in the source line SL can be set to 0 V. Additionally, an erase operation at the time of conducting the test is not required. Therefore, as compared with the first and second embodiments, consumption power can be further reduced.

4. Fourth Embodiment

A semiconductor device according to a fourth embodiment will now be described. This embodiment relates to a method of identifying a position of an MH short defect by repeating the test explained in the third embodiment twice. A difference from the third embodiment alone will be described below.

4.1 Test Method

Figure 27:
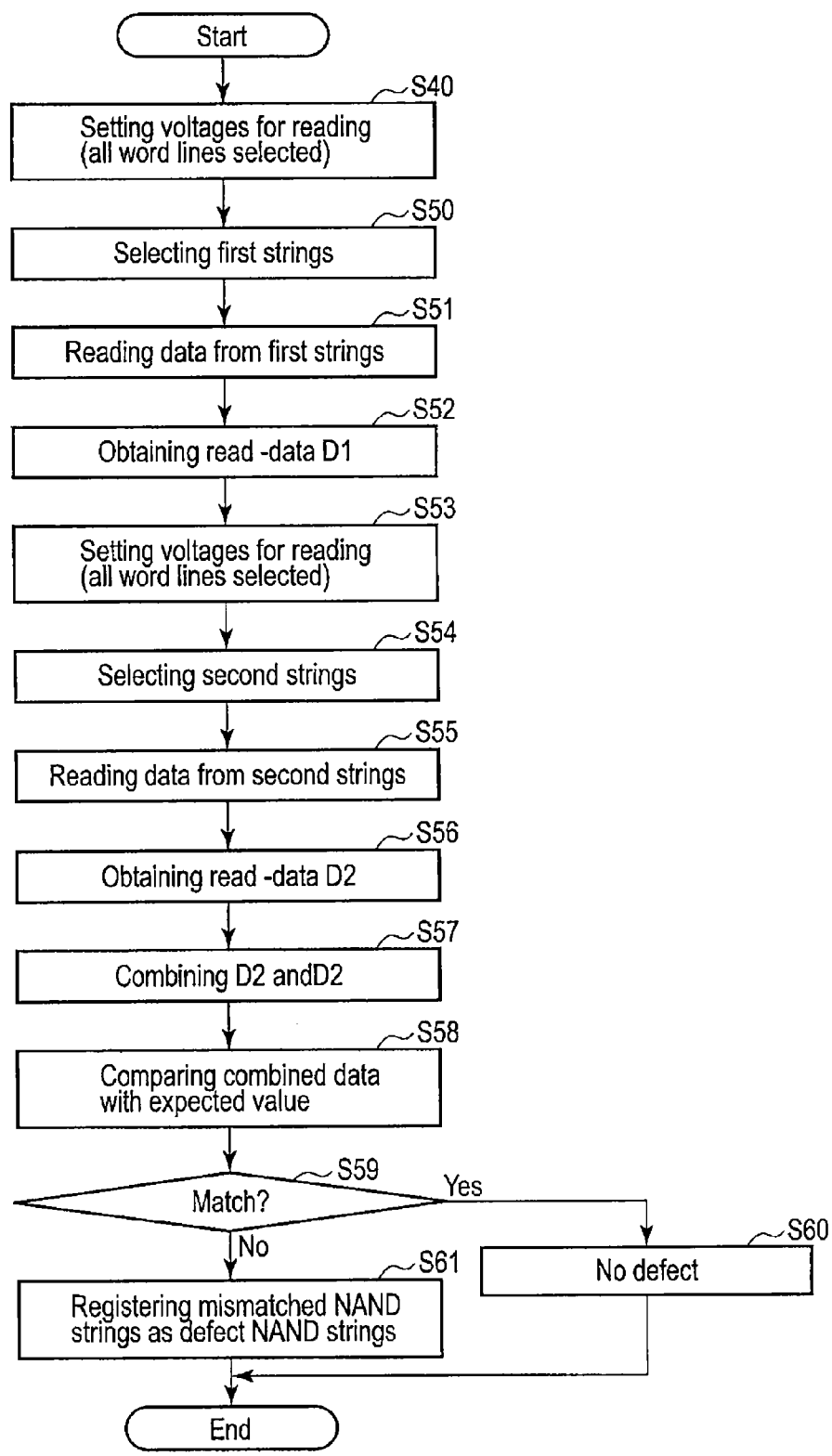
FIG. 27 is a flowchart of a test method according to a fourth embodiment.

A test method according to this embodiment will now be described with reference to FIG. 27. FIG. 27 is a flowchart showing a flow of processing of the test method. The processing shown in FIG. 27 is mainly conducted under control of a sequencer 13.

First, the processing of the step S40 explained in conjunction with FIG. 20 is carried out. Then, the sequencer 13 selects a first string 16-1 (a step S50) and reads data from the first string 16-1 (a step S51). That is, each odd-numbered bit line BL is grounded, each even-numbered bit line BL is connected to a sense circuit 40, and the sense circuit 40 senses and amplifies data read from the even-numbered bit line BL.

Furthermore, the sequencer 13 transmits a read data pattern D1 obtained at the step S51 to a controller 30 (a step S52). It is to be noted that data of the even-numbered bit line BL alone can be obtained at the step S51, the sequencer 13 complements data "0" as data of the odd-numbered bit line BL and generates the data pattern D1. The controller 300 holds the received data pattern D1 in, e.g., a RAM 320.

With this operation, a first test is completed. Subsequently, the sequencer 13 conducts a second test. That is, the sequencer 13 selects a second string 16-2 (steps S53 and S54) and reads data from the second string 16-2 (a step S55). That is, the even-numbered bit line BL is grounded, the odd-numbered bit line EL is connected to the sense circuit 40, and the sense circuit 40 senses and amplifies data read from the odd-numbered bit line BL.

Moreover, the sequencer 13 transmits the read data pattern D2 obtained at the step S55 to the controller 300 (a step S56). It is to be noted that data of the odd-numbered bit line BL alone can be obtained at the step S55, the sequencer 13 complements the data "0" as data of the even-numbered bit line BL and generates the data pattern D2. The controller 300 holds the received data pattern D2 in, e.g., the RAM 320.

With this operation, the second test is completed. Subsequent operations are carried out by, e.g., a CPU 330 of the controller 300. First, the CPU 330 combines the received data patterns D1 and D2 with each other (a step S57). As an example of combination, the CPU 330 performs a logical OR operation of the data patterns D1 and D2. Furthermore, the CPU 330 compares a result of the operation obtained at the step S57 with an expectation value (a step S58). In this example, the expectation value is a data pattern in which all bits are "1".

If both values coincide with each other as a result of comparison (a step S59, YES), the CPU 330 determines that an MH short failure is not present (a step S60). On the other hand, if both the values do not coincide with each other, it is determined that an MH short failure is present between corresponding bit lines BL or between string units SU adjacent to each other in a bit line direction. Moreover, the CPU 330 registers string units SU in which an MH short failure is present as a defective string. This point is the same as the second embodiment.

4.2 Specific Example of Test

Figure 28:
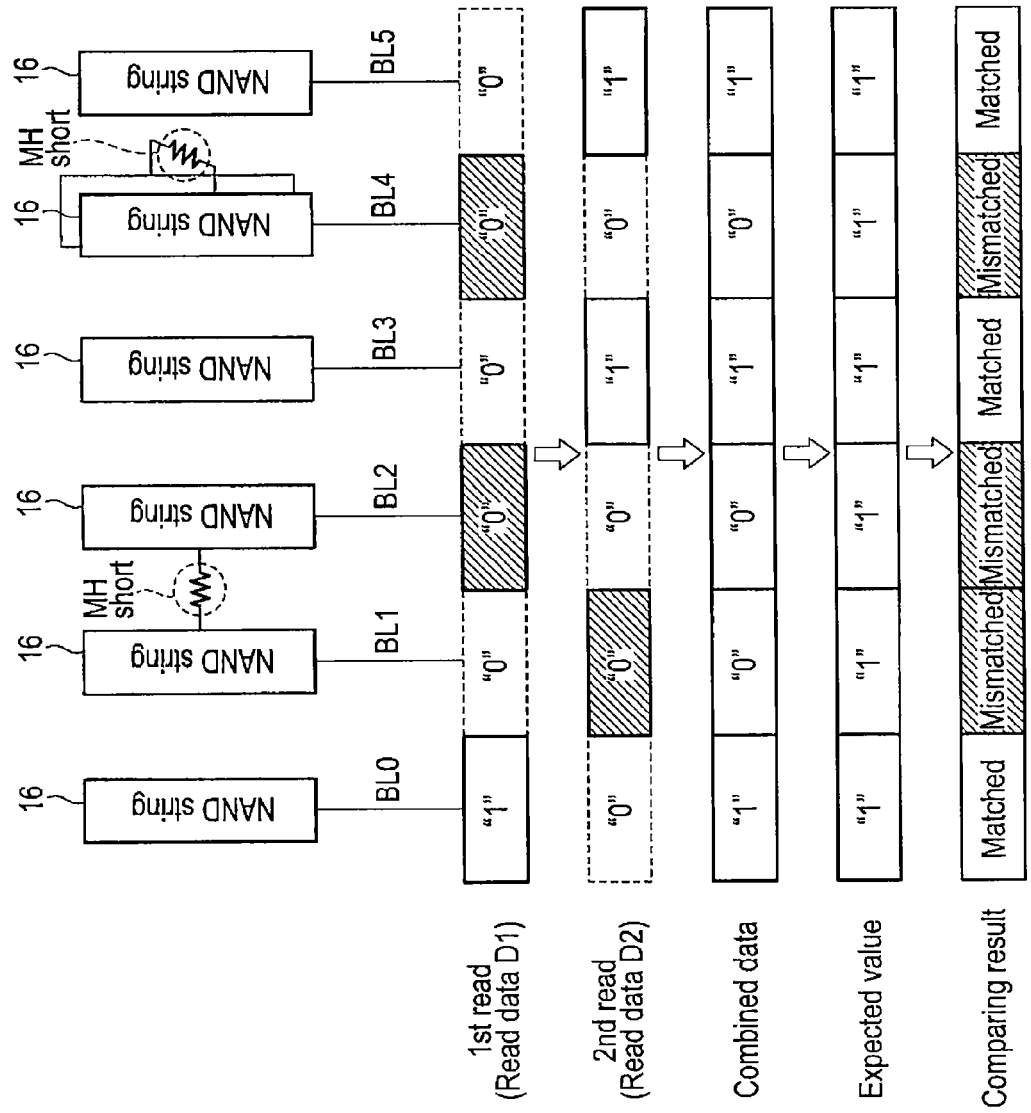
FIG. 28 is a conceptual view showing the test method according to the fourth embodiment.

A specific example of the test method according to this embodiment will now be described with reference to FIG. 28. FIG. 28 is a schematic view showing the concept of the test method, and it sequentially shows data patterns obtained at the respective steps in FIG. 27. To simplify the explanation, the number of the bit lines BL is 5 (BL0 to BL4). Further, a description will be given as to an example where an MH short failure is present between the NAND string 16 connected to the bit line BL2 and the NAND string 16 connected to the bit line BL3 and an MH short failure is present between the adjacent string units SU in the NAND string 16 connected to the bit line BL4.

As shown in the drawing, first, the sequencer 13 conducts a first test. A data pattern D1 obtained at this time is "100000" (the step S51 or S52). In this 6-bit data, values of second, fourth, and sixth bits are associated with unselected odd-numbered bit lines, and they are complemented by the sequencer 13. A third bit in the 6-bit data is "0" due to the MH short failure of Case I, and a fifth bit in the same is "0" due to the MH short failure of Case II. This data pattern "100000" is transmitted to the controller 300.

Subsequently, the sequencer 13 executes a second test. A data pattern obtained at this time is "000101" (the step S55 or S56). In this 6-bit data, values of first, third, and fifth bits are associated with unselected even-numbered bit lines, and they are complemented by the sequencer 13. Furthermore, a second bit in the 6-bit data is "0" due to the MH short failure of Case I. This data pattern "000101" is transmitted to the controller 300.

The CPU 330 of the controller 300 uses the data pattern D1="100000" and the data pattern D2="000101" to execute a logical OR operation in accordance with each bit (the step S57). A result of the operation is "100101". Furthermore, the CPU 330 compares the result of the operation with an expectation value (the step S58). The expectation value is "111111". Then, the second, third, and fifth bits from the top doe not coincide. Therefore, the CPU 330 can grasp that the NAND string 16 connected to the bit lines BL1, BL2 and BL4 associated with each of these bits has the MH short failure.

4.3 Effect According to this Embodiment

With the configuration according to this embodiment, the bit line BL as a read target is changed and a second test is conducted. Therefore, it is possible to not only confirm whether the MH short failure is present but also identify a position of the MH short failure. Accordingly, a test accuracy can be improved as compared with the third embodiment.

It is to be noted that the description has been given as to the example where the controller 300 executes the processing of the steps S27 to S29 in this embodiment. However, the sequencer 13 may execute this processing. Moreover, although the description has been given as to the example where the first string 16-1 is first selected and then the second string 16-2 is selected in this embodiment, the order may be reversed.

Additionally, in the examples shown in FIG. 27 and FIG. 28, the description has been given as to the situation where the data patterns D1 and D2 are generated by complementing the data "0" as data concerning each unselected bit line. However, the data "1" may be complemented. In this case, the combining process at the step S57 may be a logical AND operation of the data patterns D1 and D2. Specifically, in FIG. 28, the data pattern D1 may be set to "110101", the data pattern D2 may be set to "101111", and the logical AND operation of these patterns may be executed. A result of the logical AND operation in this case is "100101" like FIG. 28.

5. Fifth Embodiment

A semiconductor memory device according to a fifth embodiment will now be described. This embodiment relates to a method of detecting a failure of Case III explained in the first embodiment with reference to FIG. 16. A difference from the first embodiment alone will be described hereinafter.

5.1 Test Method of Semiconductor Memory Device

Figure 29:
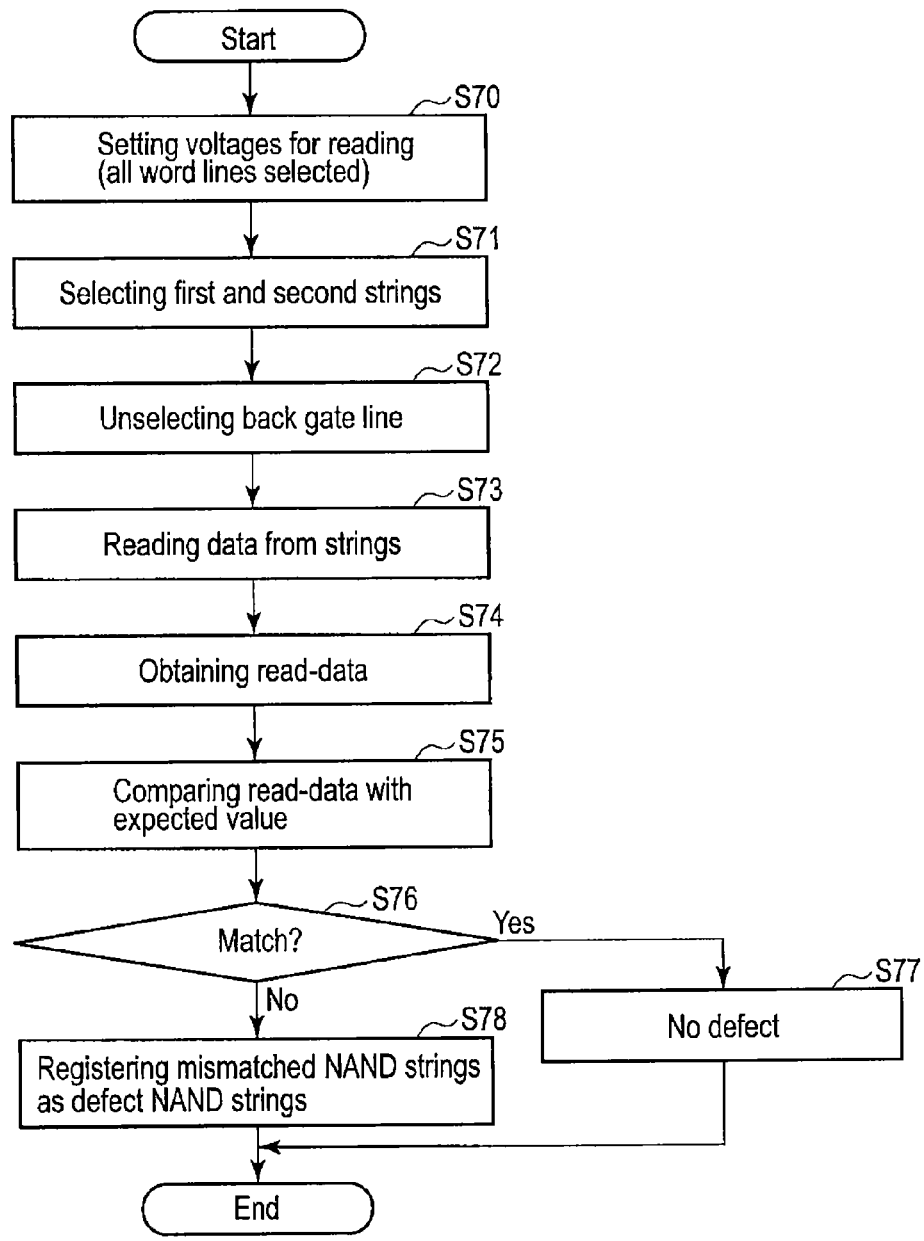
FIG. 29 is a flowchart of a test method according to a fifth embodiment.

A test method according to this embodiment will now be explained with reference to FIG. 29. FIG. 29 is a flowchart showing a flow of processing of the test method. The processing in FIG. 29 is mainly executed under control of the sequencer 13.

First, for example, a controller 300 issues a test command to a NAND type flash memory 200. In response to this, the sequencer 13 starts the test.

The sequencer 13 first instructs voltage generation circuits 11 and 12 and a row decoder 5 to generate a voltage required for reading data and apply this voltage to each wiring line (a step S70). Further, the sequencer 13 selects both a first string 16-1 and a second string 16-2 (a step S71). Furthermore, a back-gate line BG is set to an unselected state (a step S72). A sense circuit 40 collectively reads data from the first and second strings 16-1 and 16-2 of a selected string unit SU (a step S73). That is, data is read in pages.

Figure 31:
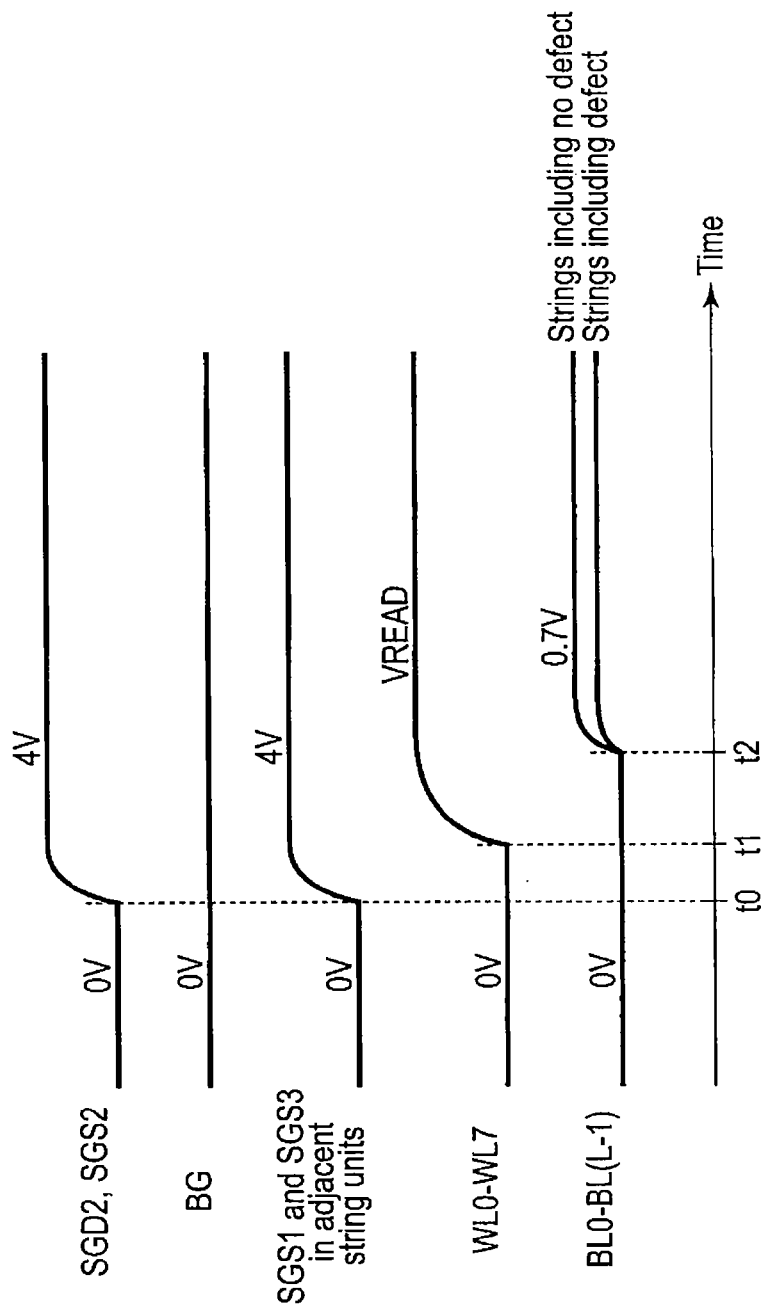
FIG. 31 is a timing chart showing signals of various interconnects in the test method according to the fifth embodiment.

FIG. 30 and FIG. 31 show a state of the steps S70 to S73. FIG. 30 is a circuit diagram of a memory cell array 2 at the steps S70 to S73, and it shows a case where a string unit SU2 is selected. Furthermore, FIG. 31 is a timing chart showing a voltage of each wiring line.

First, based on a row address supplied from a sequencer 13, a row decoder 5 applies a voltage VSG (e.g., 4V) to select gate lines SGD2 and SGS2 of the selected string unit SU2. As a result, in the selected string unit SU2, selection transistors ST1 and ST2 are turned on. Moreover, the row decoder 5 also applies the voltage VSG to select gate lines SGS1 and SGS3 of unselected string units SU1 and SU3 adjacent to the selected string unit SU2. As a result, in the unselected string units SU1 and SU3, selection transistors ST2 are turned on, and selection transistors ST1 are turned off.

Subsequently, the row decoder 5 applies a voltage VREAD to all word lines WL0 to WL7. As a result, in the selected string unit SU2, all memory cell transistors MT are turned on. Furthermore, the row decoder 5 sets a back-gate line BG to 0 V. As a result, a back-gate transistor BT is turned off.

Then, bit lines BL0 to BL(L-1) are connected to a sense circuit 40. If there is no MH short failure, each bit line BL maintains approximately 0.7 V which is a precharge potential. If there is an MH short failure, the potential in each bit line BL is lowered to approximately 0 V.

Again referring to FIG. 29, the description will be continued. Subsequently, the sequencer 13 transmits the read data pattern obtained at the step S73 to the controller 300 (a step S74). The controller 300 holds the received data pattern D2 in, e.g., a RAM 320.

Subsequent operations are executed by, e.g., the CPU 330 of the controller 300. First, the CPU 330 compares the received data pattern with an expectation value (a step S75). In this example, the expectation value is a data pattern in which all bits are "1".

As a result of the comparison, if both values coincide with each other (a step S76, YES), the CPU 330 determines that there is no MH short failure of Case III (a step S77). On the other hand, if they do not coincide with each other, it is determined that the MH short failure of Case III is present in a corresponding NAND string 16 (a step S77). Moreover, the CPU 330 registers a string unit SU in which the MH short failure has occurred as a defective string. This point is the same as the second embodiment.

5.2 Specific Example of Test, Part 1 (No Short-circuit Failure)

Figure 32:
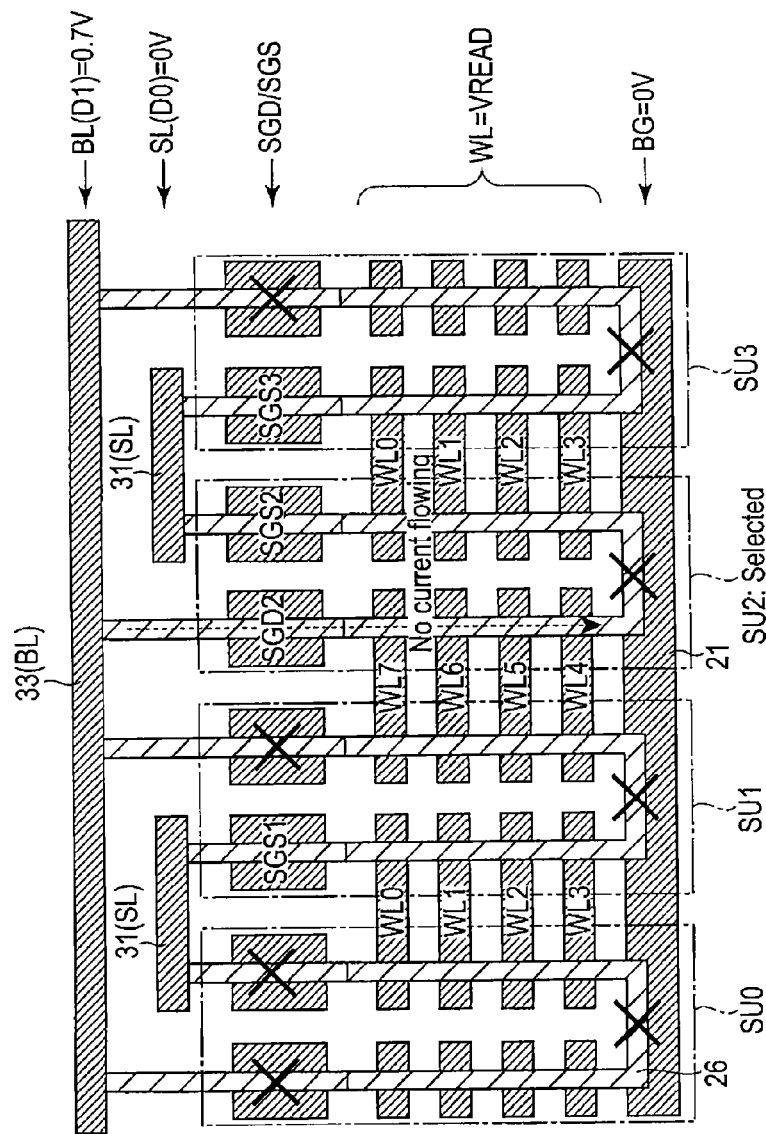

A specific example of the detail of the test will now be described. First, a case where the MH short failure of Case III is not present will be explained with reference to FIG. 32. FIG. 32 is a cross-sectional view of the memory cell array 2 along a bit line direction, and it shows a state of the step S73. Additionally, FIG. 32 shows a case where the string unit SU2 is selected, and each cross mark in the drawing shows a corresponding transistor is OFF.

As shown in the drawing, the sense amplification circuit 40 applies 0.7 V to all the bit lines BL. Further, in the selected string unit SU2, both the selection transistors ST1 and ST2 are ON. However, since 0 V is applied to the back-gate line, the back-gate transistor BT is OFF. Therefore, a current path is not formed in the selected string unit SU2. That is, a current path reaching a source line SL from the bit line BL through the selection transistor ST1, the memory cell transistors MT, and the selection transistor ST2 is cut by a back-gate transistor BT.

Therefore, a potential 0.7 V is maintained in the bit line BL, and the sense circuit 40 determines that read data is data "1" (a step S76, YES). Therefore, it is determined that there is no short-circuit defect (a step S77).

5.3 Specific Example of Test, Part 2 (with Short-circuit Failure)

A case where the MH short failure of Case III is present will now be described with reference to FIG. 33. FIG. 33 is a cross-sectional view of the memory cell array 2, and it is associated with FIG. 32. A difference from FIG. 32 lies in that two memory holes facing each other in the bit line direction short-circuit in a given NAND string 16 in the selected string unit 2.

In this case, as shown in FIG. 33, even if the back-gate transistor BT is OFF, a current path is formed in this NAND string 16. That is, it is a current path that reaches the source line SL from the bit line BL through the selection transistor ST1, the memory cell transistors MT, the MB short failure, the memory cell transistors MT, and the selection transistor ST2.

Therefore, a potential in the bit line BL is lowered to approximately 0 V, and the sense circuit 40 determines that the read data is data "0" (the step S76, NO). Therefore, it is determined that there is a short-circuit defect (a step S78).

5.4 Effect According to this Embodiment

According to this embodiment, the MH short failure in the NAND string 16 can be detected. At this time, like the third and fourth embodiments, substantially executing the data read operation alone enables conducting the test. Therefore, the test operation of the semiconductor memory device can be accelerated, and power consumption can be further reduced.

Furthermore, according to this embodiment, like the first to fourth embodiments, the same test operation does not have to be repeated. That is, the read operation at the step S73 is performed in pages. Therefore, the test operation can be further accelerated.

6. Sixth Embodiment

A semiconductor memory device according to a sixth embodiment will now be described. This embodiment concerns a configuration in which memory holes 24 are arranged in a staggered pattern in the third embodiment. Points different from the third embodiment alone will be described hereinafter.

6.1 Configuration of Memory Cell Array 2

Figure 34:
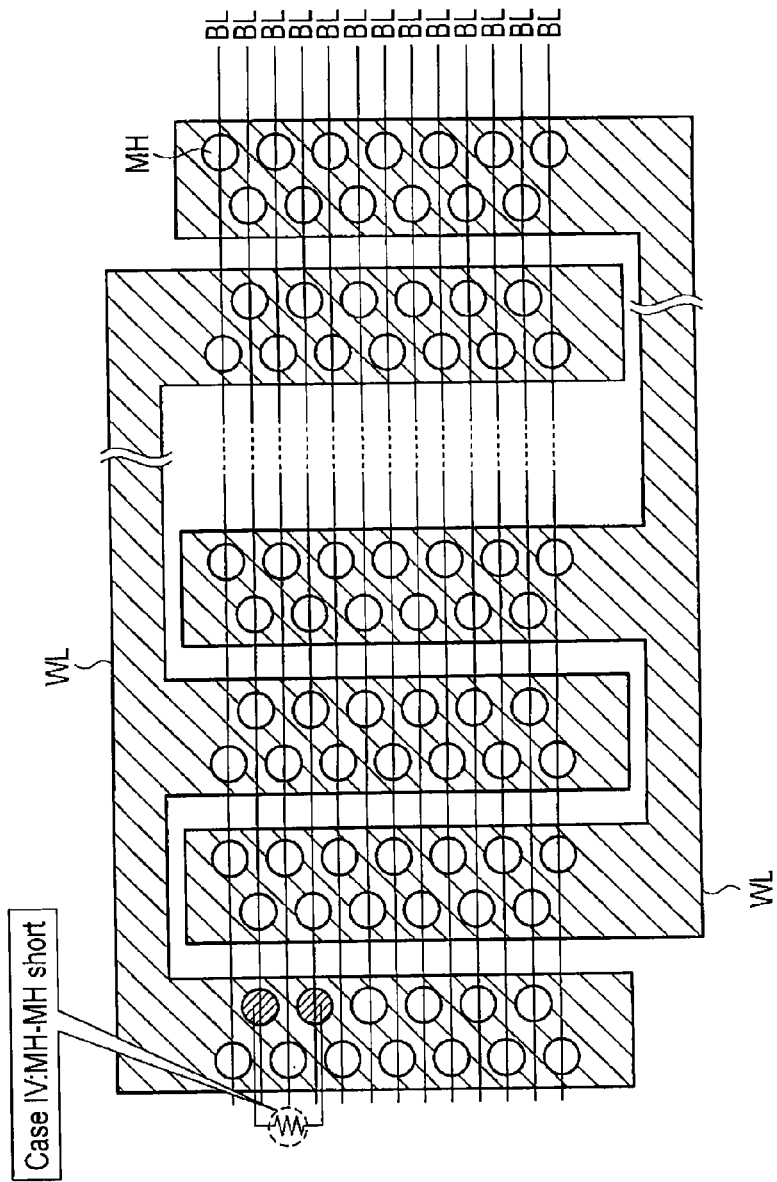
FIG. 34 and FIG. 35 are a plan view and a cross-sectional view of a memory cell array according to a sixth embodiment.
Figure 35:
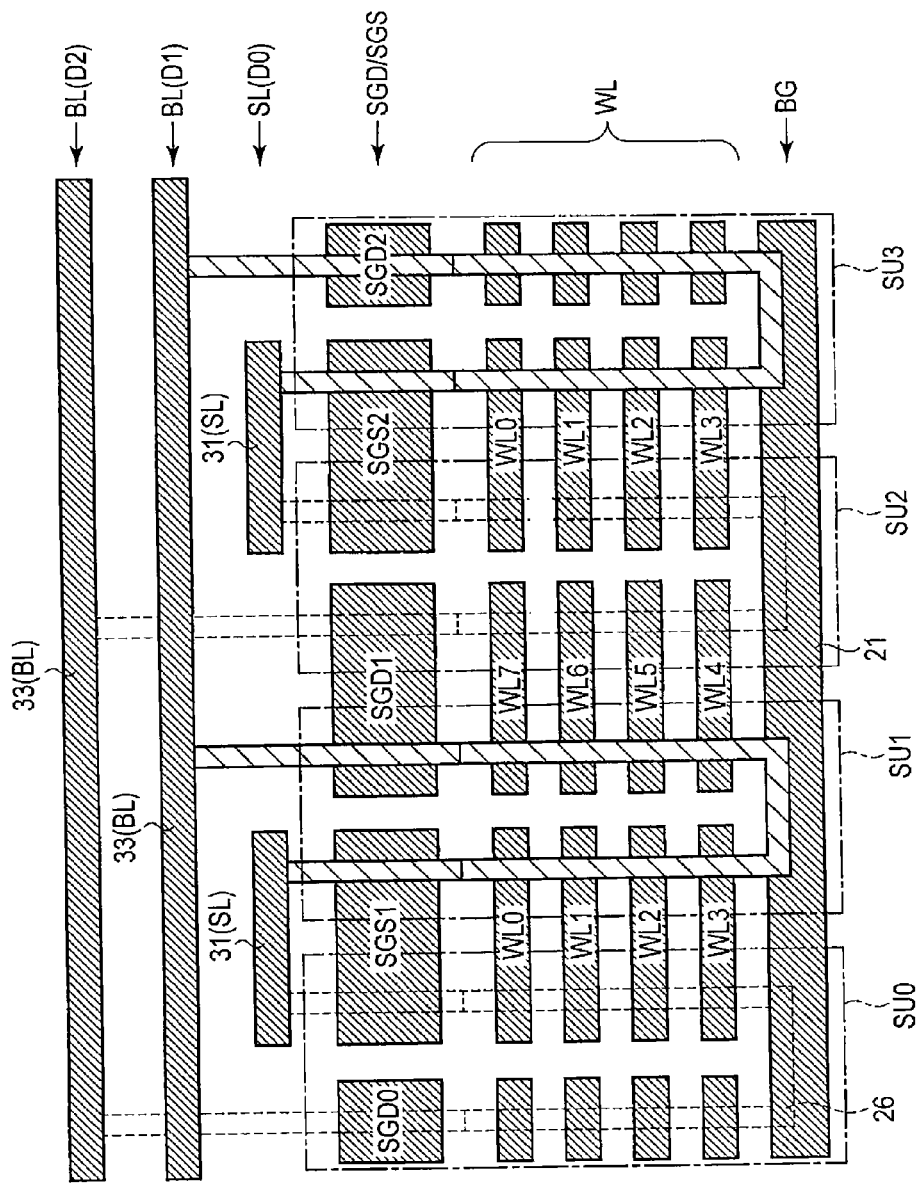

FIG. 34 is a plan view of word lines according to this embodiment, and FIG. 35 is a cross-sectional view of a memory cell array along a bit line direction.

As shown in the drawings, in the configuration according to this embodiment, as different from the configuration described in conjunction with FIG. 16, memory holes 24 are arranged in a staggered pattern. Further, the memory holes 24 arranged in the same column are connected to the same bit line BL. Therefore, a different bit line BL that is not connected to NAND strings 16, which are adjacent to each other along a word line direction, runs between these NAND strings 16.

Furthermore, as shown in FIG. 35, the two NAND strings 16 adjacent to each other in a bit line direction share a selection gate line SGD or SGD. Moreover, the bit lines BL is formed by using two layers. For example, each even-numbered bit line is formed by using a layer D1, and each odd-numbered bit line is formed by using a layer D2 placed above the layer D1. The even-numbered bit line and the odd-numbered bit line may be formed by using the same layer.

As described above, when the bit lines BL are formed by using the two layers D1 and D2, the memory holes 24 can be arranged in the staggered pattern, and an integration degree of the memory cells can be thereby improved.

Moreover, in this configuration, as shown as CASE IV in FIG. 34, a short-circuit failure of two memory holes connected to the two bit lines adjacent to each other to sandwich a given bit line therebetween may possibly occur.

6.2 Configuration of Sense Amplifier

FIG. 36 is an example of a circuit diagram of a sense amplifier 3 according to this embodiment. A configuration according to this embodiment is different from the configuration described with reference to FIG. 19 in that connection between each bit line BL and each sense circuit 40 is controlled every other pair of bit lines BL adjacent to each other.

That is, in the configuration shown in FIG. 19, every other bit line BL is connected to the sense circuit 40. On the other hand, in the configuration according to this embodiment, each pair of bit line BL are connected to or disconnected from the sense circuits 40.

6.3 Test Method of Semiconductor Memory Device

Figure 37:
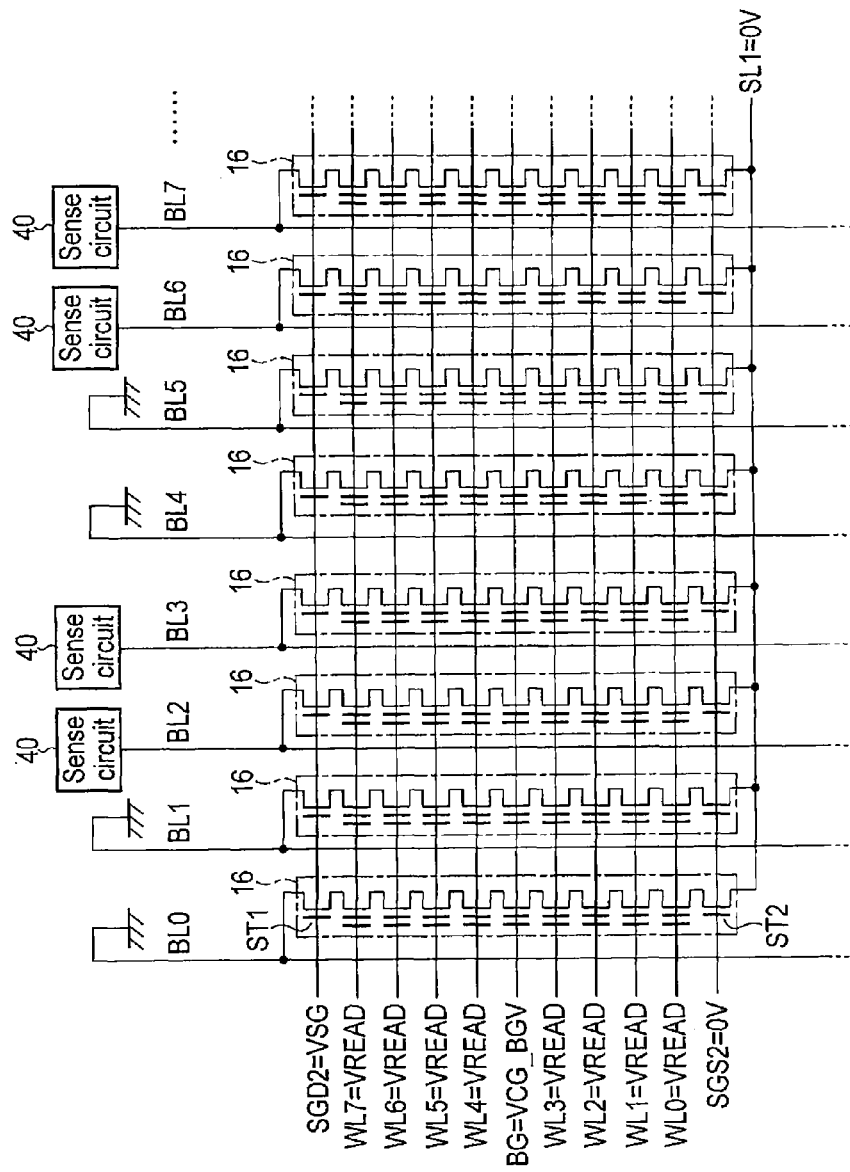
FIG. 37 and FIG. 38 are circuits diagrams of the memory cell array according to the sixth embodiment.

A test method according to this embodiment will now be described. In the test method according to this embodiment, every other pair of bit lines BL are connected to or disconnected from the sense circuits 40 in the method described in the third embodiment. FIG. 37 shows a state of the steps S40 to S42 in FIG. 20 described in the third embodiment. FIG. 37 is a circuit diagram of the memory cell array 2, and it shows any selected string unit SU.

As shown in the drawing, in this example, bit lines BL (4i) and BL (4i+1) are grounded (i is an integer), and bit lines BL (4i+2) and BL (4i+3) are connected to the sense circuits 40. More specifically, bit lines BL0 and BL1 are grounded, bit lines BL2 and BL3 are connected to the sense circuits 40, bit lines BL4 and BL5 are grounded, bit lines BL6 and BL7 are connected to the sense circuits 40, and so forth. Voltages applied to the word lines WL and the select gate lines SGD and SGS are the same as those in the third embodiment.

Figure 38:
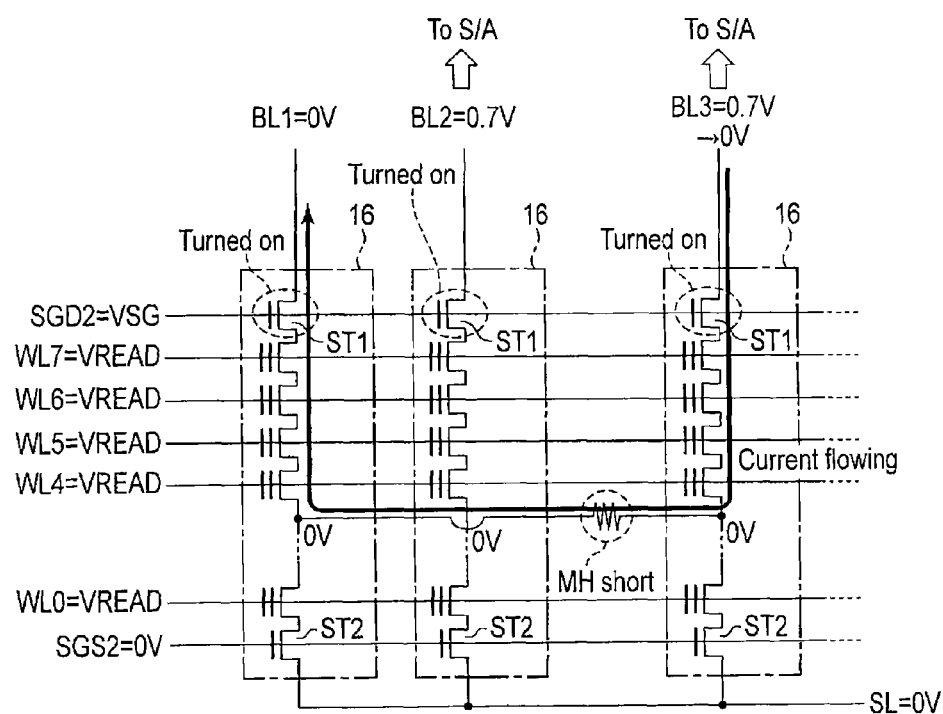

FIG. 38 is associated with FIG. 24 in the third embodiment, and it shows a specific example when an MH short failure of CASE IV has occurred.

As shown in the drawing, the MH short failure of CASE IV is an MH short failure between the two NAND strings 16 adjacent to each other to sandwich a given NAND string 16 therebetween as seen in an equivalent circuit. The example in FIG. 38 represents a situation where an MH short failure has occurred between the NAND string 16 connected to the bit line BL1 and the NAND string 16 connected to the bit line B 3.

In this case, a current path that reaches the bit line BL1 from the bit line BL3 through the MH short failure is formed. Therefore, a potential in the bit line BL3 is reduced to approximately 0 V, and the sense circuit 40 determines that read data is "0". As a result, a sequencer 13 can determine that a short circuit failure is present.

6.4 Effect According to this Embodiment

With the configuration according to this embodiment, it is possible to detect the MH short failure of CASE IV that can occur when the memory holes 24 are arranged in such a staggered pattern as shown in FIG. 34.

It is to be noted that, like the fourth embodiment, when the test described in this embodiment is repeated twice, a position of the MH short failure can be identified. That is, for example, in the first test, the bit lines BL (4i) and BL (4i+1) are grounded, and the bit lines BL (4i+2) and BL (4i+3) are connected to the sense circuits 40. Then, in the second test, the bit lines BL (4i) and BL (4i+1) are connected to the sense circuits 40, and the bit lines BL (4i+2) and BL (4i+3) are grounded.

7. Modifications and Others

As described above, the semiconductor memory device according to the embodiment includes: the first string (16-1 in FIG. 8); the second string (16-2 in FIG. 8); and the controller (3-5, 13 in FIG. 8). The first string (16-1 in FIG. 8) is coupled with the first bit line (BL0 in FIG. 8). The first string includes the first memory cells coupled between the first selection transistor (ST1 in FIG. 8) and the second selection transistor (ST2 in FIG. 8) in series. The second string (16-2 in FIG. 8) is coupled with the second bit line (BL1 in FIG. 8) and adjacent to the first string. The second string includes the second memory cells coupled between the third selection transistor (ST1 in FIG. 8) and the fourth selection transistor (ST2 in FIG. 8) in series. The gates of the first and third selection transistors (ST1 in FIG. 8) are coupled in common (SGD in FIG. 7), and the gates (SGS in FIG. 8) of the second and fourth selection transistors (ST2 in FIG. 8) are coupled in common. The controller (3-5, 13 in FIG. 8) controls access to the memory cells. The controller (3-5, 13 in FIG. 8) executes writing the first data (the data "1" in FIG. 8) into the first memory cells and writing the second data (the data "0" in FIG. 8) into the second memory cells simultaneously (FIG. 8). Moreover, the controller reads data from the first and second strings (16-1, 16-2 in FIG. 10) after writing the first and second data (FIG. 10).

It is to be noted that the foregoing embodiments can be modified in many ways. For example, the operation explained in the embodiments may be carried out not only before shipment of the semiconductor memory device but also after shipment of the same. Additionally, although the description has been given as to the example where the controller 300 issues the test start command in the foregoing embodiments, the sequencer 13 in the NAND flash memory 200 may spontaneously start the test. Further, in the case of conducting the test before shipment, the operation of the controller 300 described in the foregoing embodiments may be performed by a tester. That is, for example, the processing of the steps S27 to S31 in FIG. 17 may be carried out by the tester. Furthermore, the data pattern in the steps S20 and S23 may be generated by the tester.

Moreover, the embodiments may be combined. For example, when the fourth embodiment is combined with the fifth embodiment, all MH short failures of Cases I, II, and III can be detected. The embodiments to be combined can be appropriately selected.

Additionally, the order of the processing in the flowcharts explained in the foregoing embodiments can be changed as necessary, and the pieces of processing may be executed at the same time. For example, the order of writing the first data pattern and the second data pattern is arbitrary in FIG. 17, and the order of selecting the first string 16-1 and the second string 16-2 is arbitrary in FIG. 27.

Furthermore, the combination of the data at the step S27 in FIG. 17 and the step S57 in FIG. 27 is not necessarily restricted to the logical AND operation and the logical OR operation. Various operations can be applied as long as they are operations that enable finding defective positions from the two data patterns, and various expectation values to be used can be also selected.

Moreover, the example of the three-dimensional stacked type NAND type flash memory has been explained in the foregoing embodiments. However, the three-dimensional stacked configuration is not restricted to the configuration described with reference to FIG. 4 and FIG. 5, and any other configuration may be adopted, and a configuration having no back-gate transistor BT may be used. Additionally, the present embodiment can be applied to a regular planar NAND flash memory in which memory cells are two-dimensionally aligned on a semiconductor substrate. That is, even in the planar NAND flash memory, NAND strings adjacent to each other to interpose an element isolating region may short-circuit in some cases. Therefore, to detect such a short circuit, the first to fourth embodiments can be used. The foregoing embodiments can be applied to memory devices other than the NAND type flash memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first string which is coupled with a first bit line, the first string including first memory cells coupled between a first selection transistor and a second selection transistor in series;
   a second string which is coupled with a second bit line and is adjacent to the first string, the second string including second memory cells coupled between a third selection transistor and a fourth selection transistor in series, wherein gates of the first and third selection transistors are coupled in common and gates of the second and fourth selection transistors are coupled in common; and
   a controller which controls access to the memory cells,
   wherein the controller executes writing first data into the first memory cells in the first string and writing second data into the second memory cells in the second string simultaneously, and
   the controller reads data from the first and second strings after writing the first and second data.

2. The device according to claim 1, wherein the second data is inverted data of the first data.

3. The device according to claim 1, wherein the first memory cells are connected to word lines different from each other, the second memory cells are connected to word lines different from each other, and the first string and the second string share the word lines, and
   a program voltage is applied to the word lines at the time of writing the first and second data.

4. The device according to claim 1, wherein an operation of reading data from the first and second strings is an erase verification operation.

5. The device according to claim 1, wherein the controller executes writing third data into the first memory cells and writing fourth data into the second memory cells simultaneously after reading the data,
   the controller reads data from the first and second strings after writing the third and fourth data,
   the third data is inverted data of the first data, and
   the fourth data is inverted data of the second data.

6. The device according to claim 5, wherein a result of reading after writing the first and second data and a result of reading after writing the third and fourth data are compared with an expectation value, and a string associated with any result of reading which does not coincide with the expectation value is managed as a defective position.

7. The device according to claim 6, wherein the expectation value is based on the first to fourth data.

* * * * *